(12) United States Patent
Chen et al.

(10) Patent No.: US 7,830,290 B2
(45) Date of Patent: Nov. 9, 2010

(54) SWITCHED CAPACITOR DIGITAL-TO-ANALOG CONVERTER

(75) Inventors: Chih-Wei Chen, Taipei County (TW); Lai-Ching Lin, Hsinchu County (TW)

(73) Assignee: Sunplus mMedia Inc., Hsinchu (TW)

( * ) Notice: Subject to any disclaimer, the term of this patent is extended or adjusted under 35 U.S.C. 154(b) by 75 days.

(21) Appl. No.: 12/402,501

(22) Filed: Mar. 12, 2009

(65) Prior Publication Data

US 2009/0231176 A1 Sep. 17, 2009

(30) Foreign Application Priority Data

Mar. 12, 2008 (TW) .............................. 97108701 A

(51) Int. Cl.
*H03M 1/66* (2006.01)
(52) U.S. Cl. ...................................... 341/150; 341/144
(58) Field of Classification Search .................. 341/144, 341/150
See application file for complete search history.

(56) References Cited

U.S. PATENT DOCUMENTS

| | | | |
|---|---|---|---|
| 5,790,064 A | 8/1998 | Fujimori | |
| 5,892,473 A * | 4/1999 | Shin | 341/150 |
| 5,923,275 A * | 7/1999 | Kalb | 341/150 |
| 6,147,631 A | 11/2000 | Maulik et al. | |
| 6,194,946 B1 | 2/2001 | Fowers | |
| 6,573,850 B1 | 6/2003 | Pennock | |
| 6,952,176 B2 | 10/2005 | Frith et al. | |
| 7,102,557 B1 * | 9/2006 | Frith | 341/150 |

* cited by examiner

*Primary Examiner*—Khai M Nguyen
(74) *Attorney, Agent, or Firm*—Jianq Chyun IP Office

(57) ABSTRACT

A switched capacitor digital-to-analog converter (SC-DAC) is provided. The SC-DAC of the present invention can eliminate an influence of a reference voltage source caused by a signal dependent loading at each clock cycle, so as to completely solve a harmonic distortion of an analog output signal converted by a conventional SC-DAC. In addition, when the SC-DAC of the present invention has a plurality of converting channels, since the reference voltage source is not influenced by the effect of signal dependent loading of any converting channel, so that each converting channel can be regarded to have a separate state, and thus the purpose of channel separation can be achieved.

25 Claims, 14 Drawing Sheets

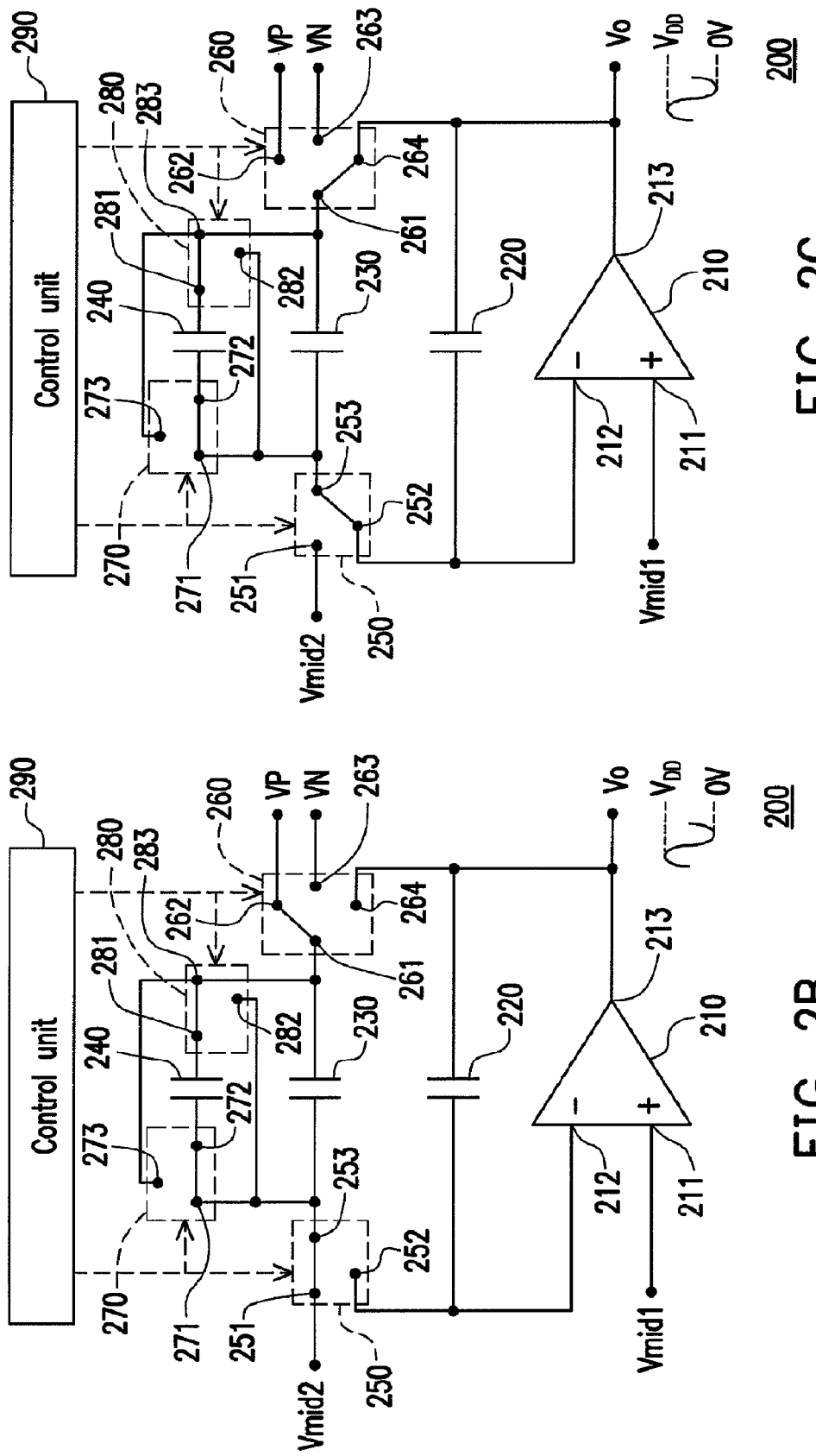

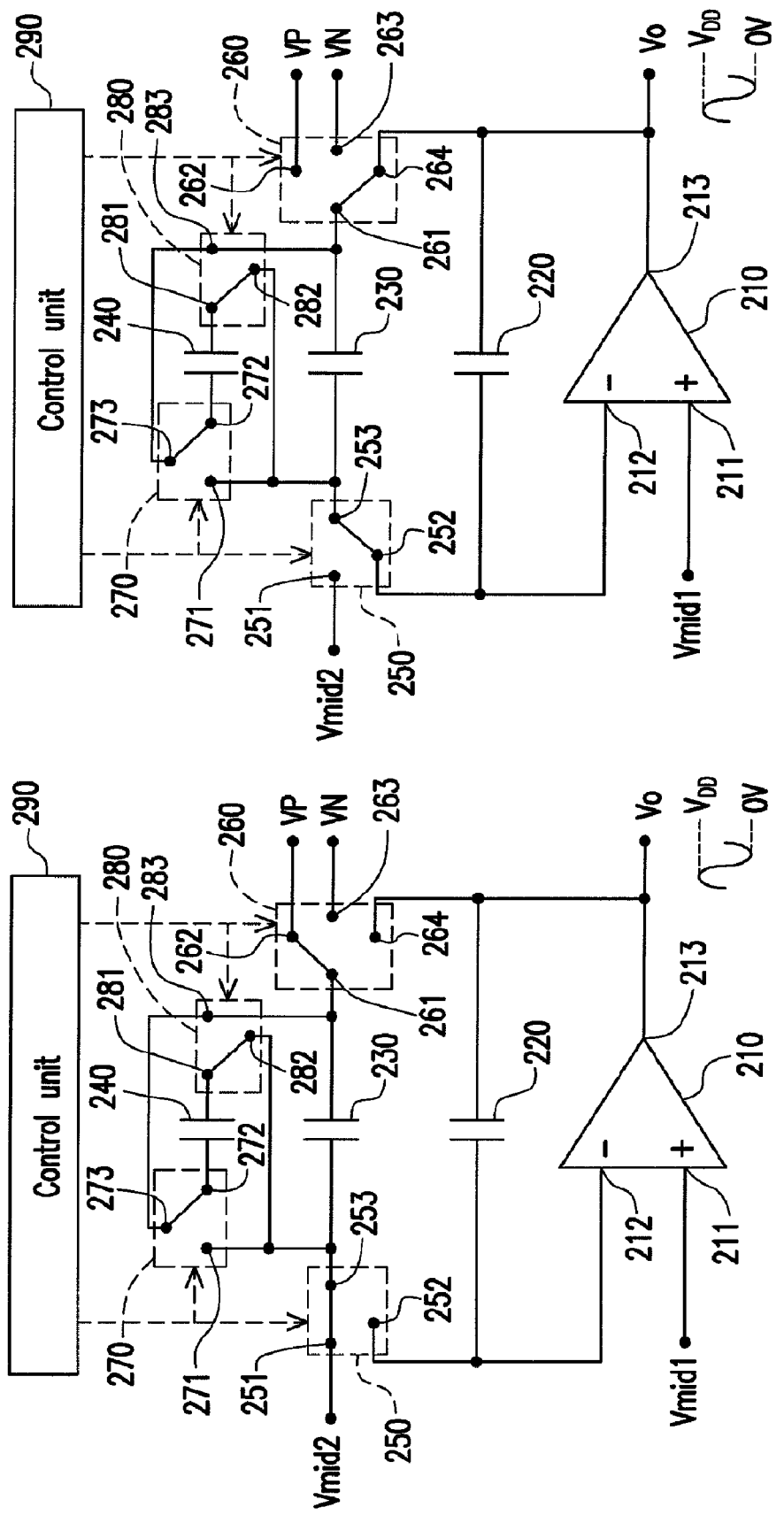

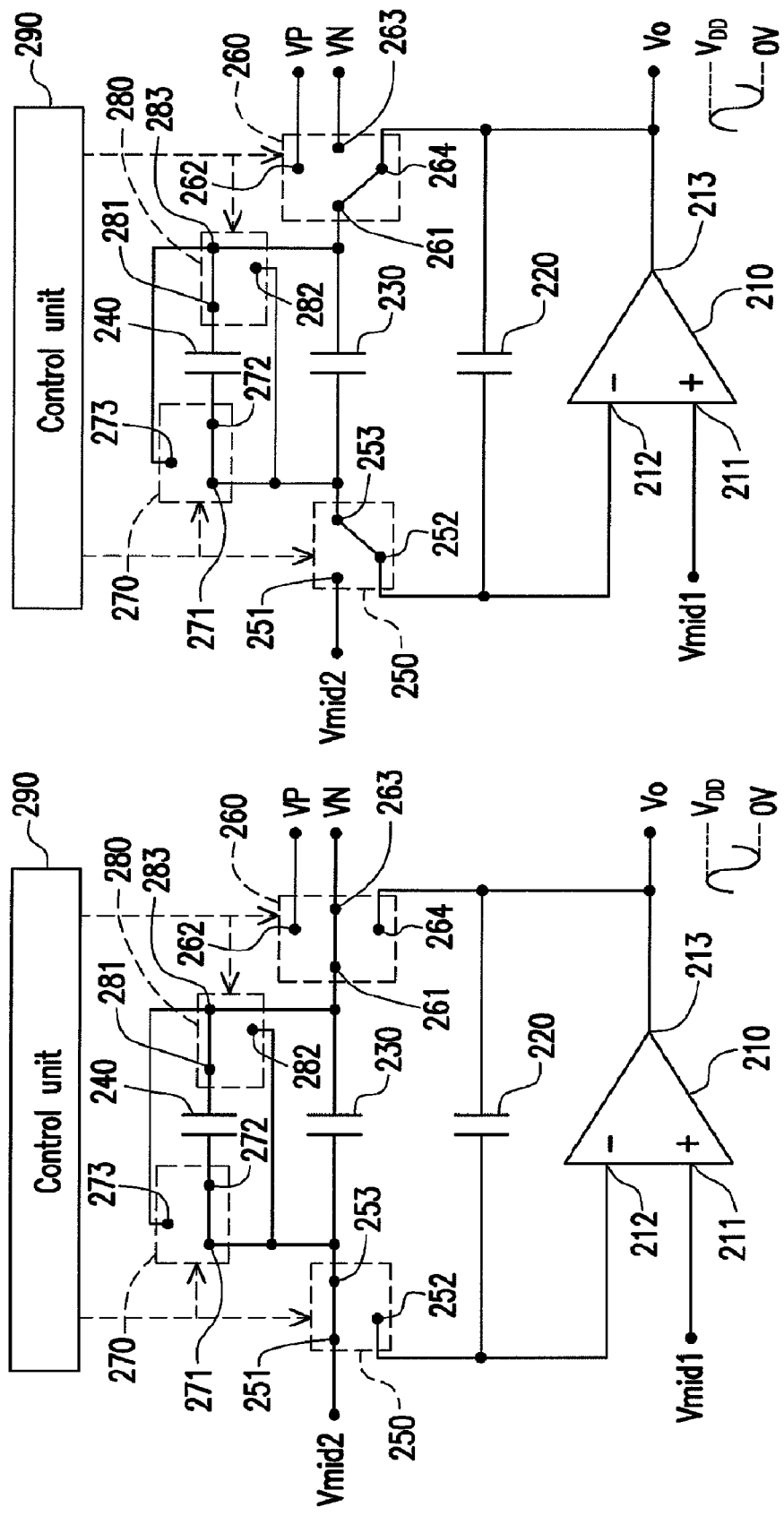

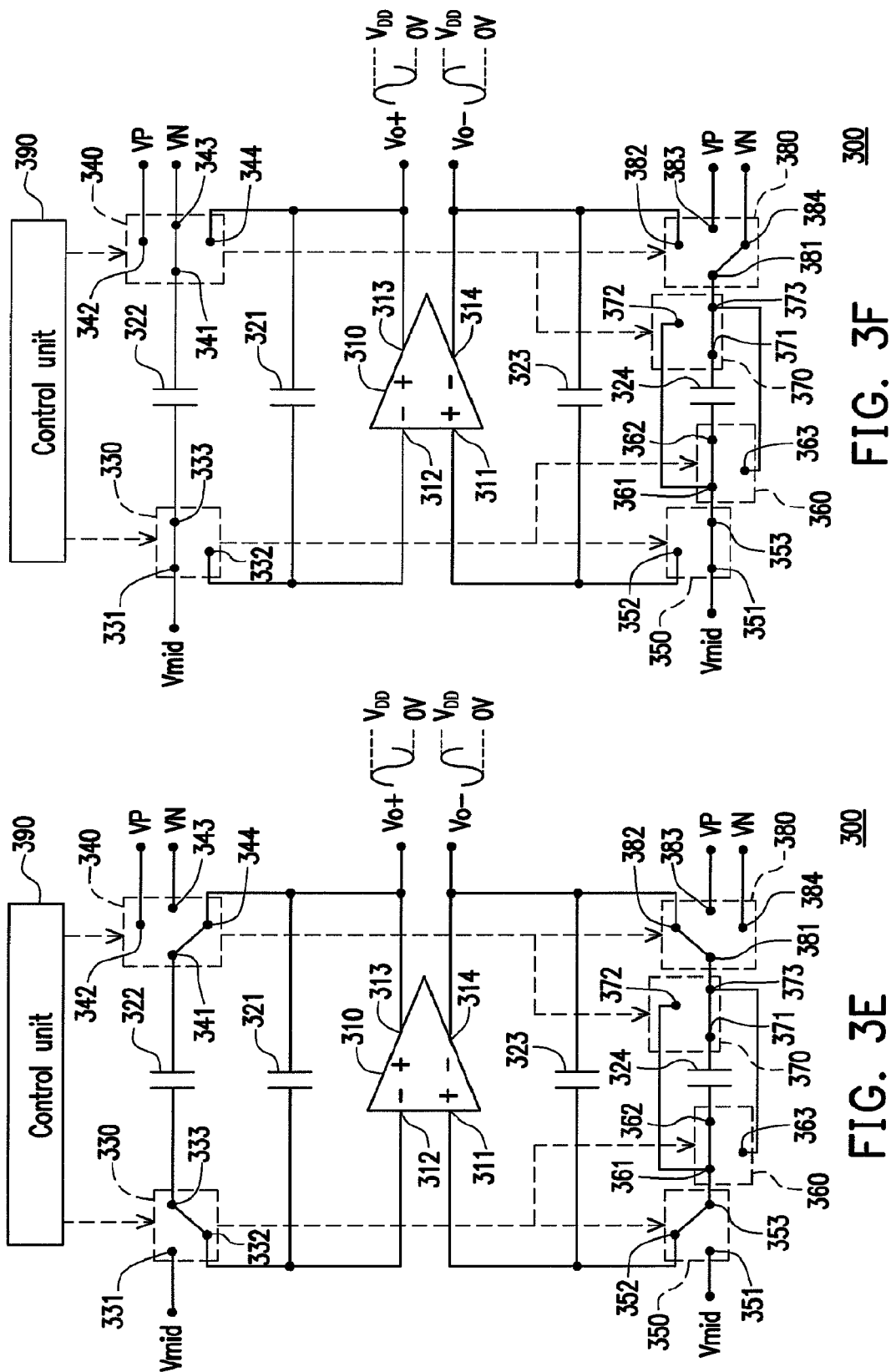

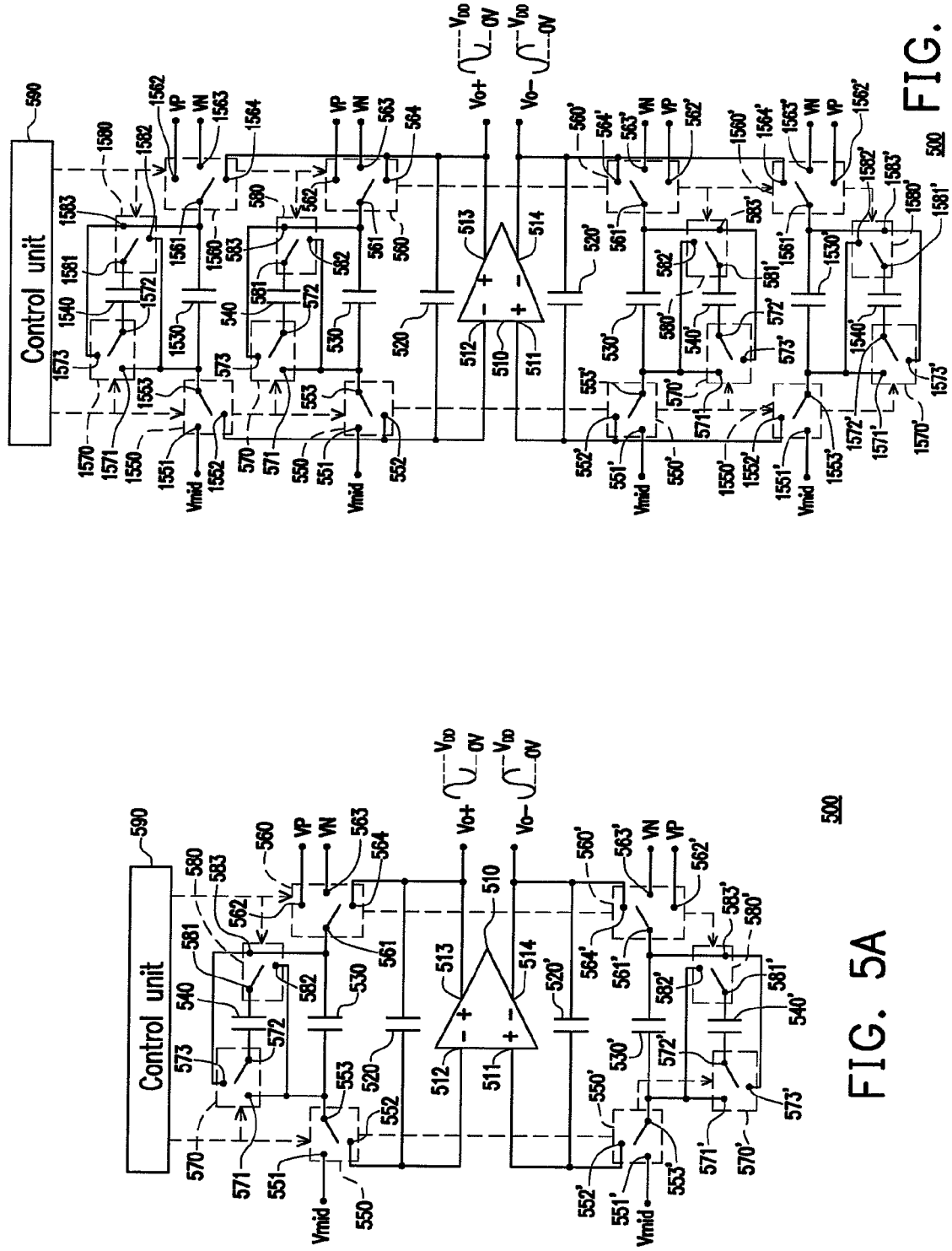

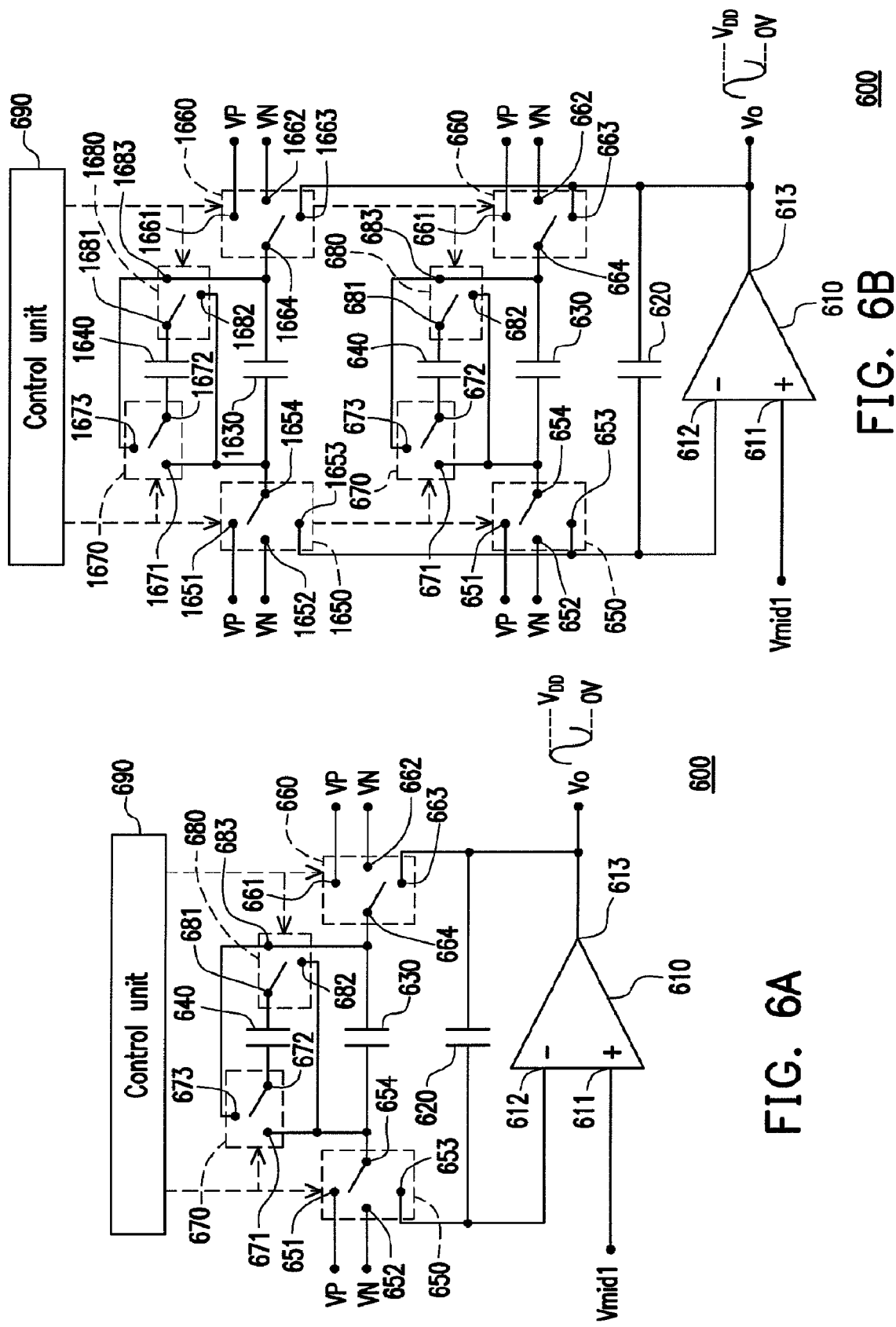

SWITCHED CAPACITOR DIGITAL-TO-ANALOG CONVERTER

CROSS-REFERENCE TO RELATED APPLICATION

This application claims the priority benefit of Taiwan application serial no. 97108701, filed on Mar. 12, 2008. The entirety of the above-mentioned patent application is hereby incorporated by reference herein and made a part of this specification.

BACKGROUND OF THE INVENTION

1. Field of the Invention

The present invention relates to a digital-to-analog converter. More particularly, the present invention relates to a switched capacitor digital-to-analog converter.

2. Description of Related Art

Generally, for an audio-visual system, resolution of a digital-to-analog converter (DAC) therein used for data conversion is a key factor that influences music quality presented by the audio-visual system.

Therefore, a switched capacitor digital-to-analog converter (SC-DAC) with a high resolution is developed based on a conventional technique to cope with demand of market. The SC-DAC may convert a series of single/multi-bit digital signals represented by delta-sigma into analog signals. A circuit structure and an operation principle of the conventional SC-DAC will now be described more fully with reference of an accompanying drawing.

FIG. 1 is a circuit diagram illustrating a conventional single ended structure SC-DAC 100. Referring to FIG. 1, the SC-DAC 100 includes an operation amplifier 110, capacitors 120 and 130, and switches 140 and 150. A non-inverting input terminal 111 of the operational amplifier 110 is used for receiving a reference level Vmid1, one terminal of the capacitor 120 is coupled to an inverting input terminal 112 of the operational amplifier 110, and another terminal of the capacitor 120 is coupled to an output terminal 113 of the operational amplifier 110.

A first terminal 141 of the switch 140 is used for receiving a reference level Vmid2, and a second terminal 142 of the switch 140 is coupled to the inverting input terminal 112 of the operational amplifier 110. One terminal of the capacitor 130 is coupled to a third terminal 143 of the switch 140, and another terminal of the capacitor 130 is coupled to a first terminal 151 of the switch 150. A second terminal 152 of the switch 150 is used for receiving a signal VP (generally having a logical high level $V_{DD}$, and is supplied from an external voltage source which is not shown in FIG. 1), a third terminal 153 of the switch 150 is used for receiving a signal VN (generally having a logical low level 0V, and is supplied from the external voltage source), and a fourth terminal 154 of the switch 150 is coupled to the output terminal 113 of the operational amplifier 110.

In the conventional technique, to maximize an amplitude of an analog signal Vo converted by the SC-DAC 100, i.e. $0 \sim V_{DD}$, the reference levels Vmid1 and Vmid2 are generally designed to be equal, and to be a half of the logical high level $V_{DD}$ (i.e. $\frac{1}{2} \times V_{DD}$). Moreover, switching operations of the switches 140 and 150 are mainly controlled by a control unit 160.

In the circuit structure of FIG. 1, when the control unit 160 detects a state of a digital signal (having a signal digital logic bit, for example) is a series of logical high/low levels $V_{DD}$/0V, the control unit 160 then controls the first terminal 141 of the switch 140 to electrically connect to the third terminal 143 thereof, and controls the first terminal 151 of the switch 150 to electrically connect to the second terminal 152/the third terminal 153 thereof during a first period (which may also be referred to as a charge period). Therefore, the capacitor 130 is then stored with charges corresponding to a level difference between the reference level Vmid2 (i.e. $\frac{1}{2} \times V_{DD}$) and the signal VP (i.e. $V_{DD}$)/VN (i.e. 0V) during the first period.

Next, during a second period (which may also be referred to as a dump period), the control unit 160 controls the second terminal 142 of the switch 140 to electrically connect to the third terminal 143 thereof, and controls the first terminal 151 of the switch 150 to electrically connect to the fourth terminal 154 thereof. Thus, charges stored in the capacitor 130 during the first period are now transferred to the capacitor 120. Therefore, theoretically, the analog signals Vo corresponding to the series of logical high/low levels $V_{DD}$/0V digital signals are then truly reflected on the output terminal 113 of the operational amplifier 110. Wherein, the first period and the second period form a clock cycle of the SC-DAC 100.

However, since the level difference formed by the charges stored in the capacitor 130 during each second period is Vo(t)−Vmid1, and Vo(t) is a signal varied with time (t), during a very next first period, the capacitor 130 then release a signal dependent current to the external voltage source providing the signal VP/VN, namely, the external voltage source providing the signal VP/VN takes the capacitor 130 as a signal dependent loading. Accordingly, a signal dependent voltage ripple may be appeared on the reference voltage VP/VN, and an output signal of the SC-DAC 100 is direct proportional to the reference voltage VP/VN, so that the voltage ripple may be exerted to an output of an ideal digital-to-analog converter, and therefore the analog signal Vo output from the output terminal 113 of the operational amplifier 110 may have a so-called harmonic distortion phenomenon.

To effectively solve the harmonic distortion of the analog signal Vo, a digital-to-analog converter (DAC) circuit is disclosed in a U.S. Pat. No. 6,573,850 by Pennock. According to the DAC circuit disclosed by Pennock, before the capacitor 130 stores the charges, the residual charges of the capacitor 130 generated during a former clock cycle may all be discharged or may be maintained to fixed charges, so that when the capacitor 130 stores the charges, the external voltage source providing the signal VP/VN then may no be influenced by the signal dependent loading caused by the capacitor 130, and therefore the harmonic distortion of the analog signal converted by the conventional SC-DAC then may be effectively solved.

However, since according to the DAC circuit disclosed by Pennock, before the capacitor 130 stores the charges, the residual charges of the capacitor 130 generated during the former clock cycle thereof have to be totally discharged or to be maintained to the fixed charges, a clock cycle of the DAC circuit disclosed by Pennock is relatively greater than that of the SC-DAC 100 of FIG. 1, and therefore it has a shortage of low conversion speed.

Besides, a DAC circuit disclosed by Frith et al. in a U.S. Pat. No. 6,952,176 is provided to solve the harmonic distortion of the analog signal converted by the conventional SC-DAC. Such circuit structure is designed to be a differential structure, and only after each 2 clock cycles, may the harmonic distortion of the analog signal converted by the conventional SC-DAC be approximately solved (not totally solved, actually). Therefore, the DAC circuit disclosed by Frith et al. not only has a complicated circuit structure, but also cannot eliminate the influence of the signal dependent loading for each clock cycle.

SUMMARY OF THE INVENTION

Accordingly, the present invention is directed to a switched capacitor digital-to-analog converter (SC-DAC), which not only has a simple circuit structure, but also may eliminate an influence of signal dependent loading during each clock cycle, so that not only harmonic distortions of analog signals converted by a conventional SC-DAC are totally solved, but also conversion speed thereof is improved.

The present invention provides a SC-DAC including an operational amplifier, a first capacitor, a first switch, a second capacitor, a second switch, a third switch, a third capacitor and a fourth switch. The operational amplifier has a non-inverting input terminal, an inverting input terminal and an output terminal, wherein the non-inverting input terminal is used for receiving a first reference level. One terminal of the first capacitor is coupled to the inverting terminal, and another terminal of the first capacitor is coupled to the output terminal. A first terminal of the first switch is used for receiving a second reference level, and a second terminal of the first switch is coupled to the inverting input terminal.

One terminal of the second capacitor is coupled to a third terminal of the first switch. A first terminal of the second switch is coupled to another terminal of the second capacitor, a second terminal of the second switch is used for receiving a first signal, a third terminal of the second switch is used for receiving a second signal, and a fourth terminal of the second switch is coupled to the output terminal. A first terminal of the third switch is coupled to the third terminal of the first switch. One terminal of the third capacitor is coupled to a second terminal of the third switch. A first terminal of the fourth switch is coupled to another terminal of the third capacitor, a second terminal of the fourth switch is coupled to the third terminal of the first switch, and a third terminal of the fourth switch is coupled to a third terminal of the third switch and the first terminal of the second switch.

The present invention provides a SC-DAC including a fully differential operational amplifier, a first capacitor, a first switch, a second capacitor, a second switch, a third capacitor, a third switch, a fourth switch, a fourth capacitor, a fifth switch and a sixth switch. The fully differential operational amplifier has a non-inverting input terminal, an inverting input terminal, a non-inverting output terminal and an inverting output terminal. One terminal of the first capacitor is coupled to the inverting input terminal, and another terminal of the capacitor is coupled to the non-inverting output terminal.

A first terminal of the first switch is used for receiving a reference level, and a second terminal of the first switch is coupled to the inverting input terminal. One terminal of the second capacitor is coupled to a third terminal of the first switch. A first terminal of the second switch is coupled to another terminal of the second capacitor, a second terminal of the second switch is used for receiving a first signal, a third terminal of the second switch is used for receiving a second signal, and a fourth terminal of the second switch is coupled to the non-inverting output terminal.

One terminal of the third capacitor is coupled to the non-inverting input terminal, and another terminal of the third capacitor is coupled to the inverting output terminal. A first terminal of the third switch is used for receiving the reference level, and a second terminal of the third switch is coupled to the non-inverting input terminal. A first terminal of the fourth switch is coupled to a third terminal of the third switch. One terminal of the fourth capacitor is coupled to a second terminal of the fourth switch. A first terminal of the fifth switch is coupled to another terminal of the fourth capacitor, a second terminal of the fifth switch is coupled to the first terminal of the fourth switch, and a third terminal of the fifth switch is coupled to a third terminal of the fourth switch. A first terminal of the sixth switch is coupled to the third terminal of the fifth switch, a second terminal of the sixth switch is coupled to the inverting output terminal, a third terminal of the sixth switch is used for receiving the first signal, and a fourth terminal of the sixth switch is used for receiving the second signal.

The present invention provides a SC-DAC including a fully differential operational amplifier, a first capacitor, a first switch, a second capacitor, a second switch, a third capacitor, a third switch, a fourth switch, a fourth capacitor, a fifth switch and a sixth switch. The fully differential operational amplifier has a non-inverting input terminal, an inverting input terminal, a non-inverting output terminal and an inverting output terminal. One terminal of the first capacitor is coupled to the inverting input terminal, and another terminal of the capacitor is coupled to the non-inverting output terminal.

A first terminal of the first switch is used for receiving a first signal, a second terminal of the first switch is used for receiving a second signal, and a third terminal of the first switch is coupled to the inverting input terminal. One terminal of the second capacitor is coupled to a fourth terminal of the first switch. A first terminal of the second switch is coupled to another terminal of the second capacitor, a second terminal of the second switch is used for receiving the first signal, a third terminal of the second switch is used for receiving the second signal, and a fourth terminal of the second switch is coupled to the non-inverting output terminal. One terminal of the third capacitor is coupled to the non-inverting input terminal, and another terminal of the third capacitor is coupled to the inverting output terminal.

A first terminal of the third switch is used for receiving the first signal, a second terminal of the third switch is used for receiving the second signal, and a third terminal of the third switch is coupled to the non-inverting input terminal. A first terminal of the fourth switch is coupled to a fourth terminal of the third switch. One terminal of the fourth capacitor is coupled to a second terminal of the fourth switch. A first terminal of the fifth switch is coupled to another terminal of the fourth capacitor, a second terminal of the fifth switch is coupled to the first terminal of the fourth switch, and a third terminal of the fifth switch is coupled to a third terminal of the fourth switch. A first terminal of the sixth switch is coupled to the third terminal of the fifth switch, a second terminal of the sixth switch is coupled to the inverting output terminal, a third terminal of the sixth switch is used for receiving the first signal, and a fourth terminal of the sixth switch is used for receiving the second signal.

The present invention provides a SC-DAC including a fully differential operational amplifier, a first capacitor, a first switch, a second capacitor, a second switch, a third switch, a third capacitor, a fourth switch, a fourth capacitor, a fifth switch, a fifth capacitor, a sixth switch, a sixth capacitor, a seventh switch and an eighth switch. The fully differential operational amplifier has a non-inverting input terminal, an inverting input terminal, a non-inverting output terminal and an inverting output terminal. One terminal of the first capacitor is coupled to the inverting input terminal, and another terminal of the capacitor is coupled to the non-inverting output terminal.

A first terminal of the first switch is used for receiving a reference level, and a second terminal of the first switch is coupled to the inverting input terminal. One terminal of the second capacitor is coupled to a third terminal of the first switch. A first terminal of the second switch is coupled to another terminal of the second capacitor, a second terminal of the second switch is used for receiving a first signal, a third terminal of the second switch is used for receiving a second signal, and a fourth terminal of the second switch is coupled to the non-inverting output terminal. A first terminal of the third switch is coupled to the third terminal of the first switch. One terminal of the third capacitor is coupled to a second terminal of the third switch.

A first terminal of the fourth switch is coupled to another terminal of the third capacitor, a second terminal of the fourth switch is coupled to the third terminal of the first switch, and a third terminal of the fourth switch is coupled to a third terminal of the third switch and the first terminal of the second switch. One terminal of the fourth capacitor is coupled to the non-inverting input terminal, and another terminal of the fourth capacitor is coupled to the inverting output terminal. A first terminal of the fifth switch is used for receiving the reference level, a second terminal of the fifth switch is coupled to the non-inverting input terminal. One terminal of the fifth capacitor is coupled to a third terminal of the fifth switch.

A first terminal of the sixth switch is coupled to another terminal of the fifth capacitor, a second terminal of the sixth switch is used for receiving the first signal, a third terminal of the sixth switch is used for receiving the second signal, and a fourth terminal of the sixth switch is coupled to the inverting output terminal. A first terminal of the seventh switch is coupled to the third terminal of the fifth switch. One terminal of the sixth capacitor is coupled to a second terminal of the seventh switch. A first terminal of the eighth switch is coupled to another terminal of the sixth capacitor, a second terminal of the eighth switch is coupled to the third terminal of the fifth switch, and a third terminal of the eighth switch is coupled to a third terminal of the seventh switch and the first terminal of the sixth switch.

The circuit structure of the SC-DAC provided by the present invention includes a single ended structure and a differential structure, and both of the two circuit structures are quite simple, and may eliminate the influence of the signal dependent loading during each clock cycle of the SC-DAC. Thus, any SC-DAC provided by the present invention may not only solve harmonic distortions of analog signals converted by the conventional SC-DAC, but may also increase a conversion speed thereof.

In order to make the aforementioned and other objects, features and advantages of the present invention comprehensible, a preferred embodiment accompanied with figures is described in detail below.

BRIEF DESCRIPTION OF THE DRAWINGS

FIGS. 2B~2I are operational schematic diagrams of a SC-DAC according to a first embodiment of the present invention.

FIG. 3A is a circuit diagram illustrating a SC-DAC according to a third embodiment of the present invention.

FIGS. 3B~3I are operational schematic diagrams of a SC-DAC according to a third embodiment of the present invention.

FIG. 3J is a circuit diagram illustrating a SC-DAC according to a fourth embodiment of the present invention.

FIG. 5A is a circuit diagram illustrating a SC-DAC according to a seventh embodiment of the present invention.

FIG. 5B is a circuit diagram illustrating a SC-DAC according to an eighth embodiment of the present invention.

FIG. 6A is a circuit diagram illustrating a SC-DAC according to a ninth embodiment of the present invention.

FIG. 6B is a circuit diagram illustrating a SC-DAC according to a tenth embodiment of the present invention.

DESCRIPTION OF EMBODIMENTS

Technical functions to be achieved by the present invention may effectively solve harmonic distortions of analog signals converted by a conventional SC-DAC, and may also increase a conversion speed thereof. In the following content, technical features of the present invention are described in detail for those with ordinary skill in the art.

First Embodiment

Figure 1:
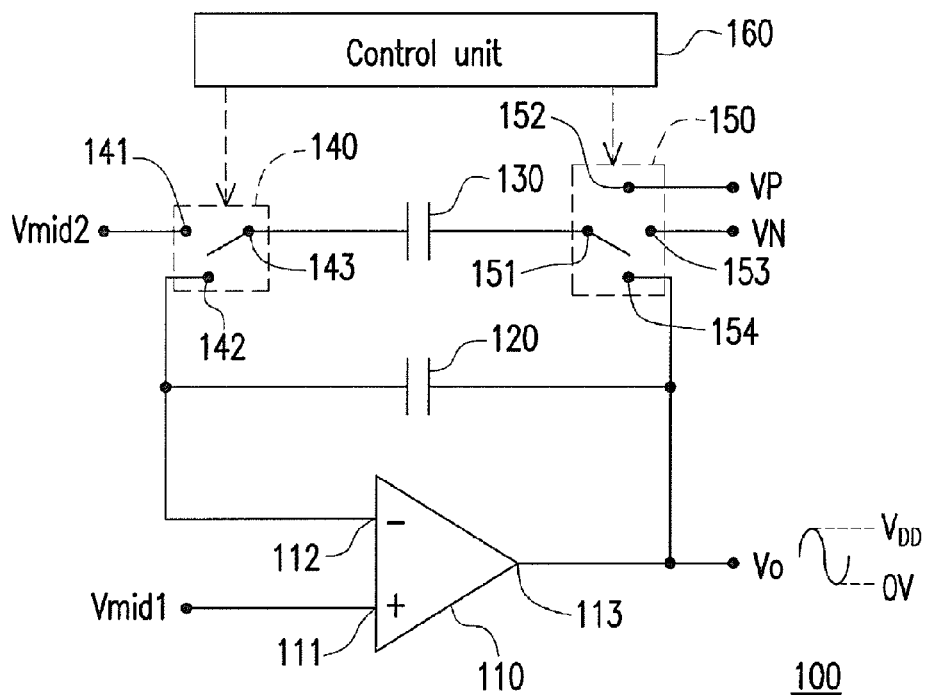
FIG. 1 is a circuit diagram illustrating a conventional single ended structure SC-DAC.
Figure 2A:
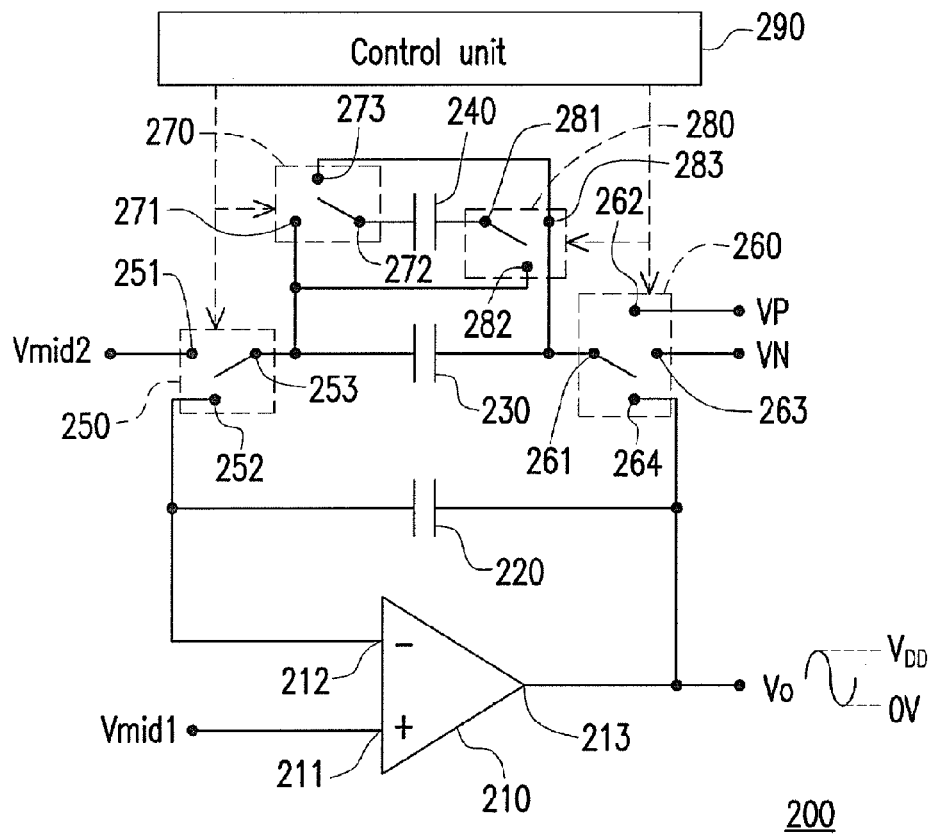
FIG. 2A is a circuit diagram illustrating a SC-DAC according to a first embodiment of the present invention.

FIG. 2A is a circuit diagram illustrating a SC-DAC 200 according to a first embodiment of the present invention. Referring to FIG. 2A, a circuit structure of the SC-DAC 200 is a single ended structure including an operational amplifier 210, a first capacitor 220, a second capacitor 230, a third capacitor 240, a first switch 250, a second switch 260, a third switch 270, a fourth switch 280 and a control unit 290. The operational amplifier 210 has a non-inverting input terminal 211, an inverting input terminal 212 and an output terminal 213, wherein the non-inverting input terminal 211 of the operational amplifier 210 is used for receiving a first reference level Vmid1.

One terminal of the first capacitor 220 is coupled to the inverting input terminal 212 of the operational amplifier 210, and another terminal of the first capacitor 220 is coupled to the output terminal 213 of the operational amplifier 210. A first terminal 251 of the first switch 250 is used for receiving a second reference level Vmid2, a second terminal 252 of the first switch 250 is coupled to the inverting input terminal 212 of the operational amplifier 210, and a third terminal 253 of the first switch 250 is coupled to one terminal of the second capacitor 230. It should be noted that to maximize an amplitude of an analog signal Vo converted by the SC-DAC 200 (i.e. $0 \sim V_{DD}$), the reference levels Vmid1 and Vmid2 are generally designed to be equal, and to be a half of a logical high level $V_{DD}$ (i.e. $\frac{1}{2} \times V_{DD}$), though the present embodiment is not limited thereto.

Another terminal of the second capacitor 230 is coupled to a first terminal 261 of the second switch 260, a second terminal 262 of the second switch 260 is used for receiving a first signal VP (generally having a logical high level $V_{DD}$, and is supplied from an external voltage source which is not shown in FIG. 2A, though the present embodiment is not limited thereto), a third terminal 263 of the second switch 260 is used for receiving a second signal VN (generally having a logical low level 0V, and is supplied from the external voltage source, though the present embodiment is not limited thereto), and a fourth terminal 264 of the second switch 260 is coupled to the output terminal 213 of the operational amplifier 210.

A first terminal 271 of the third switch 270 is coupled to the third terminal 253 of the first switch 250. One terminal of the third capacitor 240 is coupled to a second terminal 272 of the third switch 270. A first terminal 281 of the fourth switch 280 is coupled to another terminal of the third capacitor 240, a second terminal 282 of the fourth switch 280 is coupled to the third terminal 253 of the first switch 250, and a third terminal 283 of the fourth switch 280 is coupled to the third terminal 273 of the third switch 270 and the first terminal 261 of the second switch 260.

In the first embodiment, capacitances of the second capacitor 230 and the third capacitor 240 are the same, and are respectively a half of the capacitance of the capacitor 130 (i.e. the capacitor 130 in the conventional structure is equally divided into two relatively small capacitors). Moreover, the control unit 290 controls switching operations of the first, the second, the third and the fourth switches 250, 260, 270 and 280 according to a state of a first digital logic bit (i.e. a single digital logic bit).

In detail, when the control unit 290 detects the state of the first digital logic bit is the logical high level $V_{DD}$, during a first period, the control unit 290 then controls the first terminal 251 of the first switch 250 to electrically connect to the third terminal 253 thereof, controls the first terminal 261 of the second switch 260 to electrically connect to the second terminal 262 thereof, controls the first terminal 271 of the third switch 270 to electrically connect to the second terminal 272 thereof, and controls the first terminal 281 of the fourth switch 280 to electrically connect to the third terminal 283 thereof, as shown in FIG. 2B. Thus, the second capacitor 230 and the third capacitor 240 are then respectively stored with charges corresponding to a level difference between the reference level Vmid2 (i.e. ½×$V_{DD}$) and the first signal VP (i.e. $V_{DD}$) during the first period.

Next, during a second period, the control unit 290 controls the second terminal 252 of the first switch 250 to electrically connect to the third terminal 253 thereof, controls the first terminal 261 of the second switch 260 to electrically connect to the fourth terminal 264 thereof, controls the first terminal 271 of the third switch 270 to electrically connect to the second terminal 272 thereof, and controls the first terminal 281 of the fourth switch 280 to electrically connect to the third terminal 283 thereof, as shown in FIG. 2C. Thus, charges stored in the second capacitor 230 and the third capacitor 240 during the first period are now transferred to the first capacitor 220, and meanwhile signal dependent charges with the same polarity and capacity are respectively remained in the second capacitor 230 and the third capacitor 240 during the second period.

Next, during a third period, the control unit 290 controls the first terminal 251 of the first switch 250 to electrically connect to the third terminal 253 thereof, controls the first terminal 261 of the second switch 260 to electrically connect to the second terminal 262 thereof, controls the second terminal 272 of the third switch 270 to electrically connect to the third terminal 273 thereof, and controls the first terminal 281 of the fourth switch 280 to electrically connect to the second terminal 282 thereof, as shown in FIG. 2D. Thus, the second capacitor 230 and the third capacitor 240 are then again respectively stored with charges corresponding to a level difference between the reference level Vmid2 (i.e. ½×$V_{DD}$) and the first signal VP (i.e. $V_{DD}$) during the third period.

However, since polarities of the third capacitor 240 are exchanged when the second period is changed to the third period, it is obvious that the signal dependent charges in the second capacitor 230 and the third capacitor 240 remained during the second period may be counteracted during the third period. Therefore, the external voltage source providing the first signal VP is then not influenced by the signal dependent loadings of the second capacitor 230 and the third capacitor 240.

Finally, during a fourth period, the control unit 290 controls the second terminal 252 of the first switch 250 to electrically connect to the third terminal 253 thereof, controls the first terminal 261 of the second switch 260 to electrically connect to the fourth terminal 264 thereof, controls the second terminal 272 of the third switch 270 to electrically connect to the third terminal 273 thereof, and controls the first terminal 281 of the fourth switch 280 to electrically connect to the second terminal 282 thereof, as shown in FIG. 2E. Thus, charges stored in the second capacitor 230 and the third capacitor 240 during the third period are now transferred to the first capacitor 220. However, since the charges stored in the second capacitor 230 and the third capacitor 240 during the third period are not influenced by the signal dependent loadings caused by the second capacitor 230 and the third capacitor 240, harmonic distortion of the analog signal Vo output from the output terminal 213 of the operational amplifier 210 is then avoided.

Similarly, when the control unit 290 detects the state of the first digital logic bit is the logical low level 0V, during the first period, the control unit 290 then controls the first terminal 251 of the first switch 250 to electrically connect to the third terminal 253 thereof, controls the first terminal 261 of the second switch 260 to electrically connect to the third terminal 263 thereof, controls the first terminal 271 of the third switch 270 to electrically connect to the second terminal 272 thereof, and controls the first terminal 281 of the fourth switch 280 to electrically connect to the third terminal 283 thereof, as shown in FIG. 2F. Thus, the second capacitor 230 and the third capacitor 240 are then respectively stored with charges corresponding to a level difference between the reference level Vmid2 (i.e. ½×$V_{DD}$) and the second signal VN (i.e. 0V) during the first period.

Next, during the second period, the control unit 290 controls the second terminal 252 of the first switch 250 to electrically connect to the third terminal 253 thereof, controls the first terminal 261 of the second switch 260 to electrically connect to the fourth terminal 264 thereof, controls the first terminal 271 of the third switch 270 to electrically connect to the second terminal 272 thereof, and controls the first terminal 281 of the fourth switch 280 to electrically connect to the third terminal 283 thereof, as shown in FIG. 2G. Thus, charges stored in the second capacitor 230 and the third capacitor 240 during the first period are now transferred to the first capacitor 220, and meanwhile signal dependent charges with the same polarity and capacity are respectively remained in the second capacitor 230 and the third capacitor 240 during the second period.

Figures 2H, 2I:
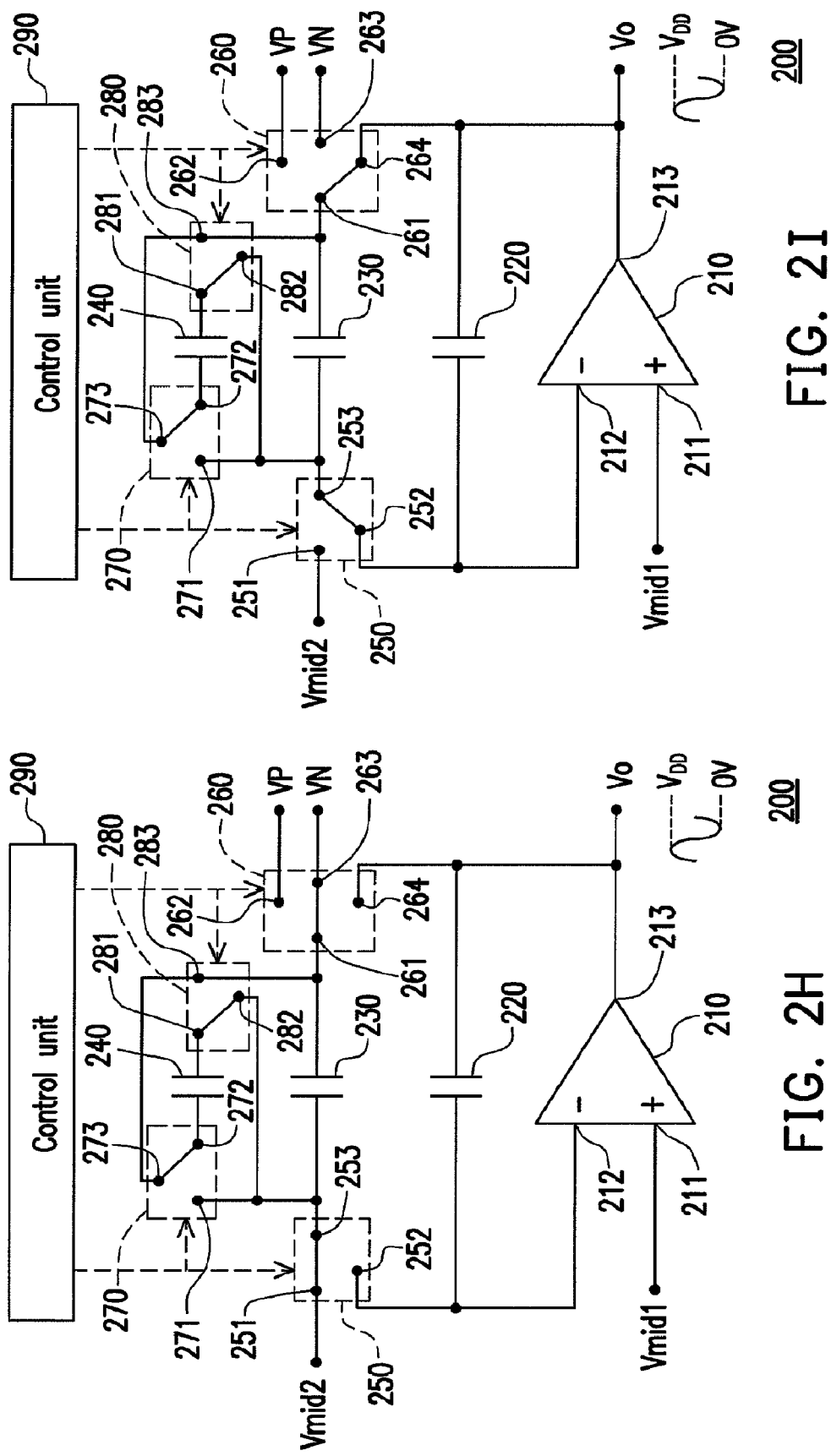

Next, during the third period, the control unit 290 controls the first terminal 251 of the first switch 250 to electrically connect to the third terminal 253 thereof, controls the first terminal 261 of the second switch 260 to electrically connect to the third terminal 263 thereof, controls the second terminal 272 of the third switch 270 to electrically connect to the third terminal 273 thereof, and controls the first terminal 281 of the fourth switch 280 to electrically connect to the second terminal 282 thereof, as shown in FIG. 2H. Thus, the second capacitor 230 and the third capacitor 240 are then again respectively stored with charges corresponding to a level difference between the reference level Vmid2 (i.e. ½×$V_{DD}$) and the second signal VN (i.e. 0V) during the third period.

However, since the polarities of the third capacitor 240 are exchanged when the second period is changed to the third period, it is obvious that the signal dependent charges in the second capacitor 230 and the third capacitor 240 remained during the second period may be counteracted during the third period. Therefore, the external voltage source providing the second signal VN is then not influenced by the signal dependent loadings of the second capacitor 230 and the third capacitor 240.

Finally, during the fourth period, the control unit 290 controls the second terminal 252 of the first switch 250 to electrically connect to the third terminal 253 thereof, controls the first terminal 261 of the second switch 260 to electrically connect to the fourth terminal 264 thereof, controls the second terminal 272 of the third switch 270 to electrically connect to the third terminal 273 thereof, and controls the first terminal 281 of the fourth switch 280 to electrically connect to the second terminal 282 thereof, as shown in FIG. 2I. Thus, charges stored in the second capacitor 230 and the third capacitor 240 during the third period are now transferred to the first capacitor 220. However, since the charges stored in the second capacitor 230 and the third capacitor 240 during the third period are not influenced by the signal dependent loadings caused by the second capacitor 230 and the third capacitor 240, the harmonic distortion of the analog signal Vo output from the output terminal 213 of the operational amplifier 210 is then avoided.

It should be noted that the first period and the second period form a clock cycle of the SC-DAC 200. Similarly, the third period and the fourth period also form the clock cycle of the SC-DAC 200.

According to the SC-DAC 200 of the first embodiment, since each time when the second period is changed to the third period, or each time when the fourth period is changed back to the first period, the signal dependent charges of the second capacitor 230 and the third capacitor 240 remained during the second period or the fourth period are counteracted, the charges of the second capacitor 230 and the third capacitor 240 stored during the first period or the third period are then not influenced by the remained signal dependent charges generated during a former clock period thereof. Accordingly, the SC-DAC 200 of the first embodiment then may eliminate the influence of the signal dependent loadings during each clock cycle, and therefore the harmonic distortions of the analog signals converted by the conventional SC-DAC are totally solved.

Moreover, in the first embodiment, the first and the second periods/the third and the fourth periods form one clock cycle of the SC-DAC 200. Therefore, the clock cycle of the SC-DAC 200 of the first embodiment is shorter compared to that of the conventional DAC provided by Pennock, so that a conversion speed of the SC-DAC 200 is also improved.

However, according to the spirit of the present invention, the SC-DAC 200 is not limited to be conversion of single digital logic bit. In the following content, conversion of two or more digital logic bits by the SC-DAC 200 is further described for those with ordinary skill in the art.

Second Embodiment

Figure 2J:
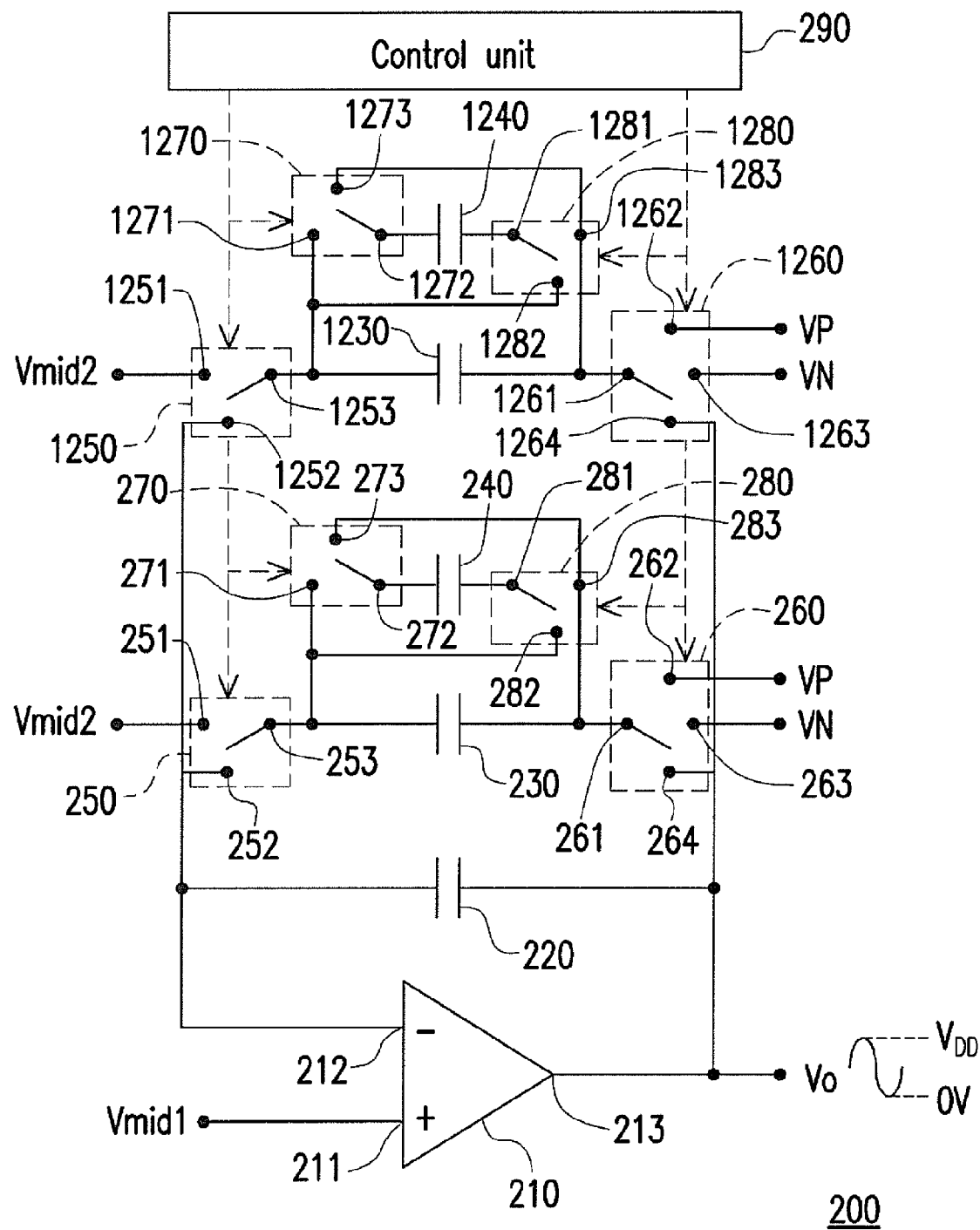
FIG. 2J is a circuit diagram illustrating a SC-DAC according to a second embodiment of the present invention.

FIG. 2J is a circuit diagram illustrating a SC-DAC 200 according to a second embodiment of the present invention. Referring to FIG. 2A and FIG. 2J, compared to FIG. 2A, the SC-DAC 200 of FIG. 2J is added with a fifth switch 1250, a fourth capacitor 1230, a sixth switch 1260, a seventh switch 1270, a fifth capacitor 1240 and an eighth switch 1280. In the second embodiment, capacitances of the fourth capacitor 1230 and the fifth capacitor 1240 are the same, and may be equal to the capacitances of the second capacitor 230 and the third capacitor 240, though the present embodiment is not limited thereto. A first terminal 1251 of the fifth switch 1250 is used for receiving the second reference level Vmid2, and a second terminal 1252 of the fifth switch 1250 is coupled to the inverting input terminal 212 of the operational amplifier 210.

One terminal of the fourth capacitor 1230 is coupled to a third terminal 1253 of the fifth switch 1250. A first terminal 1261 of the sixth switch 1260 is coupled to another terminal of the fourth capacitor 1230, a second terminal 1262 of the sixth switch 1260 is used for receiving the first signal VP, a third terminal 1263 of the sixth switch 1260 is used for receiving the second signal VN, and a fourth terminal 1264 of the sixth switch 1260 is coupled to the output terminal 213 of the operational amplifier 210.

A first terminal 1271 of the seventh switch 1270 is coupled to the third terminal 1253 of the fifth switch 1250. One terminal of the fifth capacitor 1240 is coupled to a second terminal 1272 of the seventh switch 1270. A first terminal 1281 of the eighth switch 1280 is coupled to another terminal of the fifth capacitor 1240, a second terminal 1282 of the eighth switch 1280 is coupled to the third terminal 1253 of the fifth switch 1250, and a third terminal 1283 of the eighth switch 1280 is coupled to a third terminal 1273 of the seventh switch 1270 and the first terminal 1261 of the sixth switch 1260.

In the second embodiment, the control unit 290 controls switching operations of the fifth, the sixth, the seventh and the eighth switches 1250, 1260, 1270 and 1280 according to a state of a second digital logic bit, and when the control unit 290 detects the state of the second digital logic bit is the logical high level $V_{DD}$, the switching operations of the fifth, the sixth, the seventh and the eighth switches 1250, 1260, 1270 and 1280 under control of the control unit 290 are the same to that of the first, the second, the third and the fourth switches 250, 260, 270 and 280 under control of the control unit 290 when the control unit 290 detects that the state of the first digital logic bit is the logical high level $V_{DD}$, and therefore detailed description thereof will not be repeated.

Similarly, when the control unit 290 detects the state of the second digital logic bit is the logical low level 0V, the switching operations of the fifth, the sixth, the seventh and the eighth switches 1250, 1260, 1270 and 1280 under control of the control unit 290 are then the same to that of the first, the second, the third and the fourth switches 250, 260, 270 and 280 under control of the control unit 290 when the control unit 290 detects that the state of the first digital logic bit is the logical low level 0V, and therefore detailed description thereof will not be repeated. Accordingly, the SC-DAC 200 of FIG. 2J may independently convert two digital logic bits (i.e. the first digital logic bit and the second digital logic bit).

Besides, since in the second embodiment, the capacitances of the second capacitor 230 and the third capacitor 240 are assumed to be the same to the capacitances of the fourth capacitor 1230 and the fifth capacitor 1240, intensity of the analog signal Vo on the output terminal 213 of the operational amplifier 210 is then equally contributed by the two digital logic bits, namely, a weighted ratio thereof is 1:1, though the spirit of the present invention is not limited thereto.

Namely, a multiple relation between the fourth and the fifth capacitors 1230 and 1240 and the second and the third capacitors 230 and 240 may be designed according to an actual requirement, so as to implement a different weighted ratio. For example, if the capacitances of the fourth and the fifth capacitors 1230 and 1240 are twice of the capacitances of the second and the third capacitors 230 and 240, the weighted ratio thereof is then changed to 2:1, and so on, though the present invention is not limited thereto.

Moreover, according to the second embodiment, and deduced by analogy, conversion of more than two digital logic bits by the SC-DAC 200 then may be deduced by those with ordinary skill in the art, and therefore detailed description thereof will not be repeated.

Accordingly, the present invention is not limited to the single ended structure SC-DACs disclosed in the first embodiment and the second embodiment. In the following content, a plurality of differential structure SC-DACs is provide for those with ordinary skill in the art.

Third Embodiment

Figures 3A, 3B:
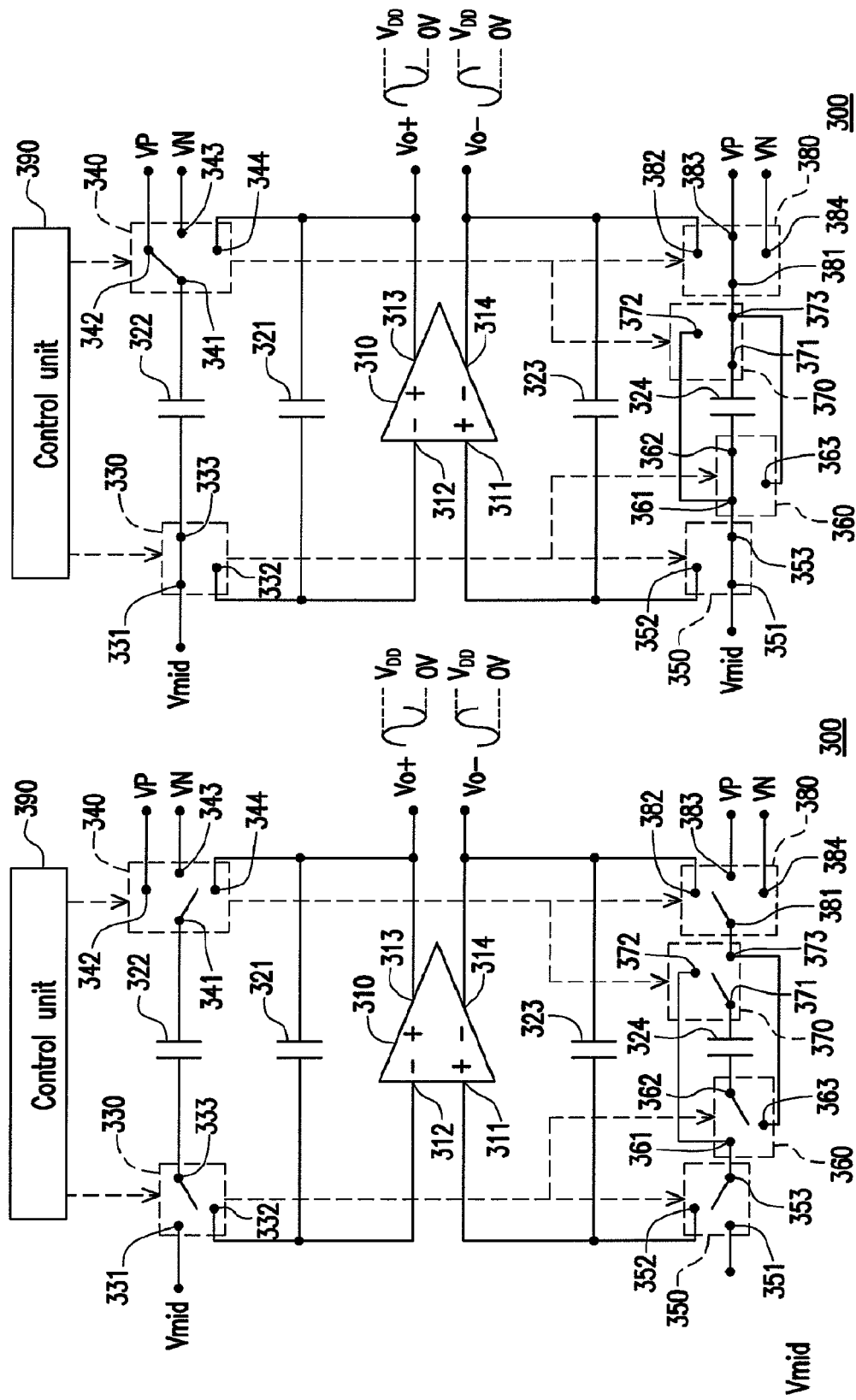

FIG. 3A is a circuit diagram illustrating a SC-DAC 300 according to a third embodiment of the present invention. Referring to FIG. 3A, a circuit structure of the SC-DAC 300 is the differential structure including a fully differential operational amplifier 310, a first capacitor 321, a first switch 330, a second capacitor 322, a second switch 340, a third capacitor 323, a third switch 350, a fourth switch 360, a fourth capacitor 324, a fifth switch 370, a sixth switch 380 and a control unit 390. The fully differential operational amplifier 310 has a non-inverting input terminal 311, an inverting input terminal 312, a non-inverting output terminal 313 and an inverting output terminal 314.

One terminal of the first capacitor 321 is coupled to the inverting input terminal 312 of the fully differential operational amplifier 310, and another terminal of the first capacitor 321 is coupled to the non-inverting output terminal 313 of the fully differential operational amplifier 310. A first terminal 331 of the first switch 330 is used for receiving a reference level Vmid, and a second terminal 332 of the first switch 330 is coupled to the inverting input terminal 312 of the fully differential operational amplifier 310. One terminal of the second capacitor 322 is coupled to a third terminal 333 of the first switch 330.

A first terminal 341 of the second switch 340 is coupled to another terminal of the second capacitor 322, a second terminal 342 of the second switch 340 is used for receiving a first signal VP (generally having a logical high level $V_{DD}$, and is supplied from an external voltage source which is not shown in FIG. 3A, though the present embodiment is not limited thereof), a third terminal 343 of the second switch 340 is used for receiving a second signal VN (generally having a logical low level 0V, and is supplied from the external voltage source, though the present embodiment is not limited thereof), and a fourth terminal 344 of the second switch 340 is coupled to the non-inverting output terminal 313 of the fully differential operational amplifier 310.

In the third embodiment, to maximize amplitudes of analog signals Vo+ and Vo− converted by the SC-DAC 300 (i.e. 0~$V_{DD}$), the reference level Vmid is generally designed to be a half of the logical high level $V_{DD}$ (i.e. $\frac{1}{2} \times V_{DD}$), though the present embodiment is not limited thereto.

One terminal of the third capacitor 323 is coupled to the non-inverting input terminal 311 of the fully differential operational amplifier 310, and another terminal of the third capacitor 323 is coupled to the inverting output terminal 314 of the fully differential operational amplifier 310. A first terminal 351 of the third switch 350 is used for receiving the reference level Vmid, and a second terminal 352 of the third switch 350 is coupled to the non-inverting input terminal 311 of the fully differential operational amplifier 310. A first terminal 361 of the fourth switch 360 is coupled to a third terminal 353 of the third switch 350. One terminal of the fourth capacitor 324 is coupled to a second terminal 362 of the fourth switch 360.

A first terminal 371 of the fifth switch 370 is coupled to another terminal of the fourth capacitor 324, a second terminal 372 of the fifth switch 370 is coupled to the first terminal 361 of the fourth switch 360, and a third terminal 373 of the fifth switch 370 is coupled to a third terminal 363 of the fourth switch 360. A first terminal 381 of the sixth switch 380 is coupled to the third terminal 373 of the fifth switch 370, a second terminal 382 of the sixth switch 380 is coupled to the inverting output terminal 314 of the fully differential operational amplifier 310, a third terminal 383 of the sixth switch 380 is used for receiving the first signal VP, and a fourth terminal 384 of the sixth switch 380 is used for receiving the second signal VN.

In the third embodiment, capacitances of the second capacitor 322 and the fourth capacitor 324 are the same. Moreover, the control unit 390 controls switching operations of the first, the second, the third, the fourth, the fifth and the sixth switches 330, 340, 350, 360, 370 and 380 according to a state of a first digital logic bit (i.e. a single digital logic bit).

In detail, when the control unit 390 detects the state of the first digital logic bit is the logical high level $V_{DD}$, during a first period, the control unit 390 then controls the first terminal 331 of the first switch 330 to electrically connect to the third terminal 333 thereof, controls the first terminal 341 of the second switch 340 to electrically connect to the second terminal 342 thereof, controls the first terminal 351 of the third switch 350 to electrically connect to the third terminal 353 thereof, controls the first terminal 361 of the fourth switch 360 to electrically connect to the second terminal 362 thereof, controls the first terminal 371 of the fifth switch 370 to electrically connect to the third terminal 373 thereof, and controls the first terminal 381 of the sixth switch 380 to electrically connect to the third terminal 383 thereof, as shown in FIG. 3B. Thus, the second capacitor 322 and the fourth capacitor 324 are then respectively stored with charges corresponding to a level difference between the reference level Vmid (i.e. $\frac{1}{2} \times V_{DD}$) and the first signal VP (i.e. $V_{DD}$) during the first period.

Figures 3C, 3D:
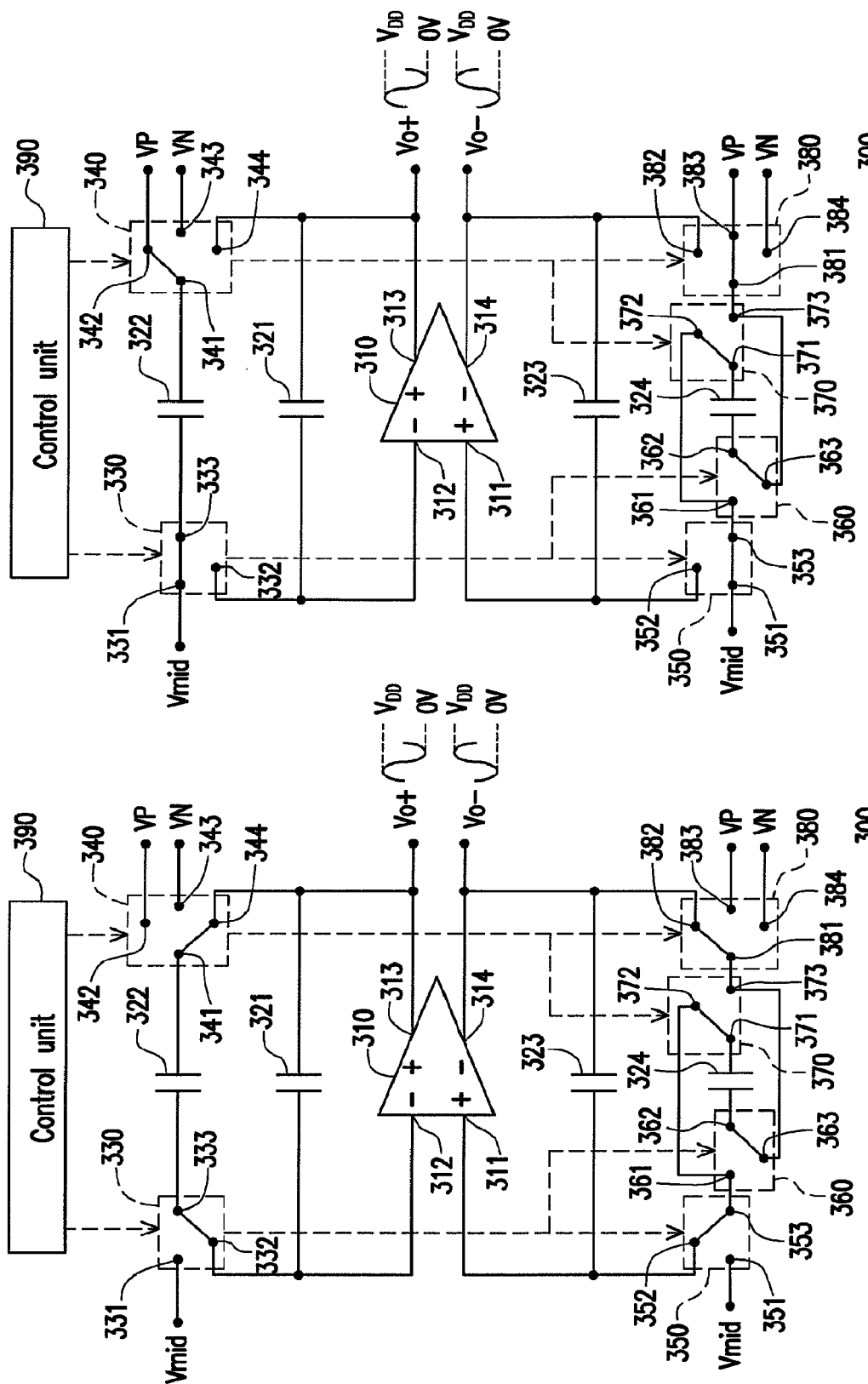

Next, during a second period, the control unit 390 controls the second terminal 332 of the first switch 330 to electrically connect to the third terminal 333 thereof, controls the first terminal 341 of the second switch 340 to electrically connect to the fourth terminal 344 thereof, controls the second terminal 352 of the third switch 350 to electrically connect to the third terminal 353 thereof, controls the second terminal 362 of the fourth switch 360 to electrically connect to the third terminal 363 thereof, controls the first terminal 371 of the fifth switch 370 to electrically connect to the second terminal 372 thereof, and controls the first terminal 381 of the sixth switch 380 to electrically connect to the second terminal 382 thereof, as shown in FIG. 3C.

Thus, charges stored in the second capacitor 322 and the fourth capacitor 324 during the first period are now respectively transferred to the first capacitor 321 and the third capacitor 323. Since polarities of the fourth capacitor 324 are exchanged when the first period is changed to the second period, so that though charge capacities stored in the first capacitor 321 and the third capacitor 323 during the second period are the same, polarities thereof are reversed. Meanwhile, signal dependent charges with the same capacity and reversed polarity are respectively remained in the second capacitor 322 and the fourth capacitor 324 during the second period.

Next, during a third period, the control unit 390 controls the first terminal 331 of the first switch 330 to electrically connect to the third terminal 333 thereof, controls the first terminal 341 of the second switch 340 to electrically connect to the second terminal 342 thereof, controls the first terminal 351 of the third switch 350 to electrically connect to the third terminal 353 thereof, controls the second terminal 362 of the fourth switch 360 to electrically connect to the third terminal 363 thereof, controls the first terminal 371 of the fifth switch 370 to electrically connect to the second terminal 372 thereof, and controls the first terminal 381 of the sixth switch 380 to electrically connect to the third terminal 383 thereof, as shown in FIG. 3D. Thus, the second capacitor 322 and the fourth capacitor 324 are then again respectively stored with charges corresponding to the level difference between the reference level Vmid (i.e. ½×$V_{DD}$) and the first signal VP (i.e. $V_{DD}$) during the third period.

However, since charge capacities stored in the second capacitor 322 and the fourth capacitor 324 during the second period are the same, and polarities thereof are reversed, it is obvious that the charges may be counteracted during the third period. Therefore, the external voltage source providing the first signal VP is then not influenced by the signal dependent loadings of the second capacitor 322 and the fourth capacitor 324.

Finally, during a fourth period, the control unit 390 controls the second terminal 332 of the first switch 330 to electrically connect to the third terminal 333 thereof, controls the first terminal 341 of the second switch 340 to electrically connect to the fourth terminal 344 thereof, controls the second terminal 352 of the third switch 350 to electrically connect to the third terminal 353 thereof, controls the first terminal 361 of the fourth switch 360 to electrically connect to the second terminal 362 thereof, controls the first terminal 371 of the fifth switch 370 to electrically connect to the third terminal 373 thereof, and controls the first terminal 381 of the sixth switch 380 to electrically connect to the second terminal 382 thereof, as shown in FIG. 3E.

Thus, charges stored in the second capacitor 322 and the fourth capacitor 324 during the third period are now respectively transferred to the first capacitor 321 and the third capacitor 323. However, since the charges stored in the second capacitor 322 and the fourth capacitor 324 during the third period are not influenced by the signal dependent loadings caused by the second capacitor 322 and the fourth capacitor 324, harmonic distortions of the analog signals Vo+ and Vo− respectively output from the non-inverting output terminal 313 and the inverting output terminal 314 of the operational amplifier 310 are then avoided.

Similarly, when the control unit 390 detects the state of the first digital logic bit is the logical low level 0V, during the first period, the control unit 390 then controls the first terminal 331 of the first switch 330 to electrically connect to the third terminal 333 thereof, controls the first terminal 341 of the second switch 340 to electrically connect to the third terminal 343 thereof, controls the first terminal 351 of the third switch 350 to electrically connect to the third terminal 353 thereof, controls the first terminal 361 of the fourth switch 360 to electrically connect to the second terminal 362 thereof, controls the first terminal 371 of the fifth switch 370 to electrically connect to the third terminal 373 thereof, and controls the first terminal 381 of the sixth switch 380 to electrically connect to the fourth terminal 384 thereof, as shown in FIG. 3F. Thus, the second capacitor 322 and the fourth capacitor 324 are then respectively stored with charges corresponding to the level difference between the reference level Vmid (i.e. ½×$V_{DD}$) and the second signal VN (i.e. 0V) during the first period.

Figures 3G, 3H:
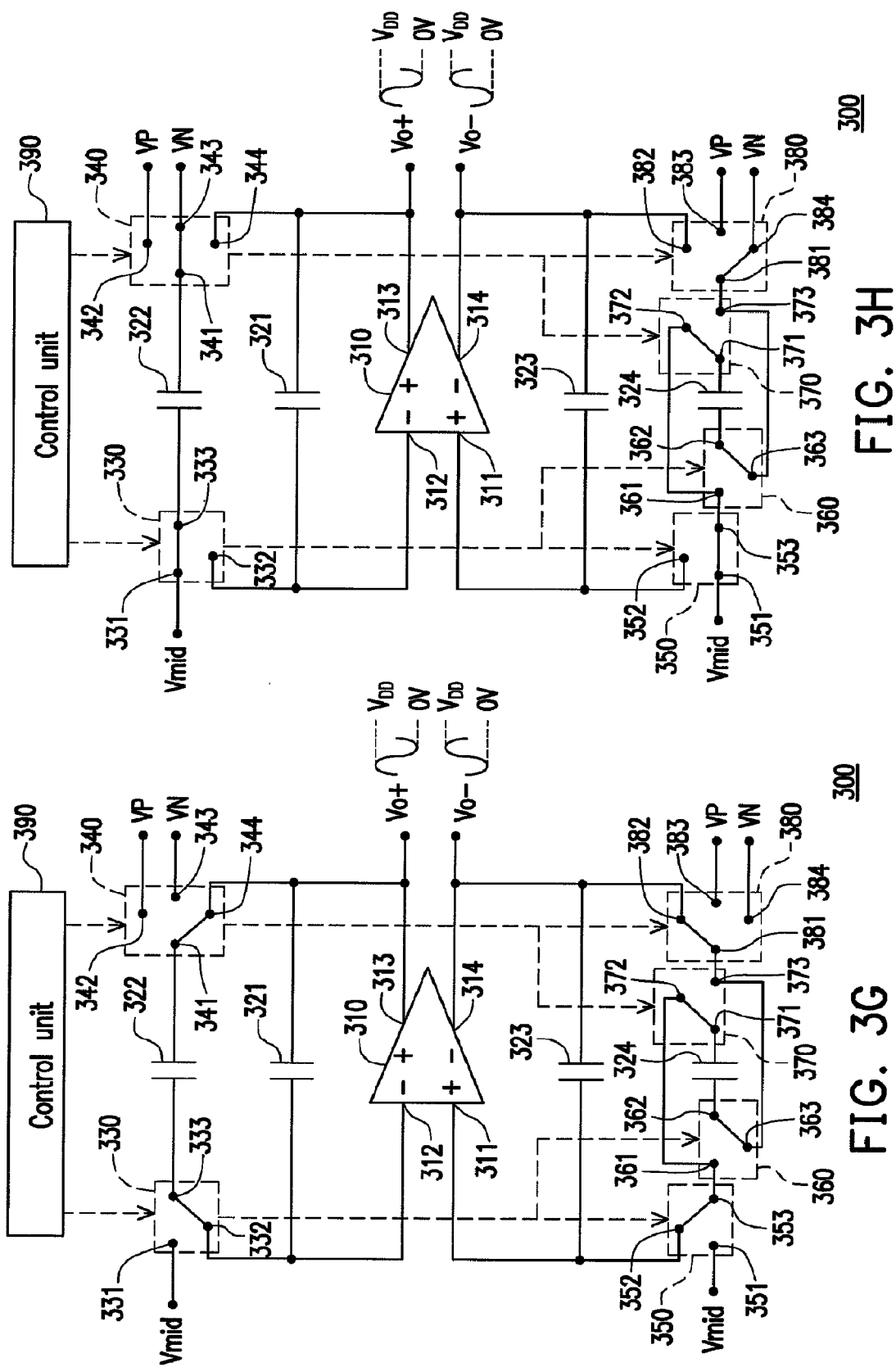

Next, during the second period, the control unit 390 controls the second terminal 332 of the first switch 330 to electrically connect to the third terminal 333 thereof, controls the first terminal 341 of the second switch 340 to electrically connect to the fourth terminal 344 thereof, controls the second terminal 352 of the third switch 350 to electrically connect to the third terminal 353 thereof, controls the second terminal 362 of the fourth switch 360 to electrically connect to the third terminal 363 thereof, controls the first terminal 371 of the fifth switch 370 to electrically connect to the second terminal 372 thereof, and controls the first terminal 381 of the sixth switch 380 to electrically connect to the second terminal 382 thereof, as shown in FIG. 3G.

Thus, charges stored in the second capacitor 322 and the fourth capacitor 324 during the first period are now respectively transferred to the first capacitor 321 and the third capacitor 323. Since polarities of the fourth capacitor 324 are exchanged when the first period is changed to the second period, so that though charge capacities stored in the first capacitor 321 and the third capacitor 323 during the second period are the same, polarities thereof are reversed. Meanwhile, signal dependent charges with the same capacity and reversed polarity are respectively remained in the second capacitor 322 and the fourth capacitor 324 during the second period.

Next, during the third period, the control unit 390 controls the first terminal 331 of the first switch 330 to electrically connect to the third terminal 333 thereof, controls the first terminal 341 of the second switch 340 to electrically connect to the third terminal 343 thereof, controls the first terminal 351 of the third switch 350 to electrically connect to the third terminal 353 thereof, controls the second terminal 362 of the fourth switch 360 to electrically connect to the third terminal 363 thereof, controls the first terminal 371 of the fifth switch 370 to electrically connect to the second terminal 372 thereof, and controls the first terminal 381 of the sixth switch 380 to electrically connect to the fourth terminal 384 thereof, as shown in FIG. 3H. Thus, the second capacitor 322 and the fourth capacitor 324 are then again respectively stored with charges corresponding to the level difference between the reference level Vmid (i.e. ½×$V_{DD}$) and the second signal VN (i.e. 0V) during the third period.

However, since charge capacities stored in the second capacitor 322 and the fourth capacitor 324 during the second period are the same, and polarities thereof are reversed, it is obvious that the charges may be counteracted during the third period. Therefore, the external voltage source providing the second signal VN is then not influenced by the signal dependent loadings of the second capacitor 322 and the fourth capacitor 324.

Figures 3I, 3J:
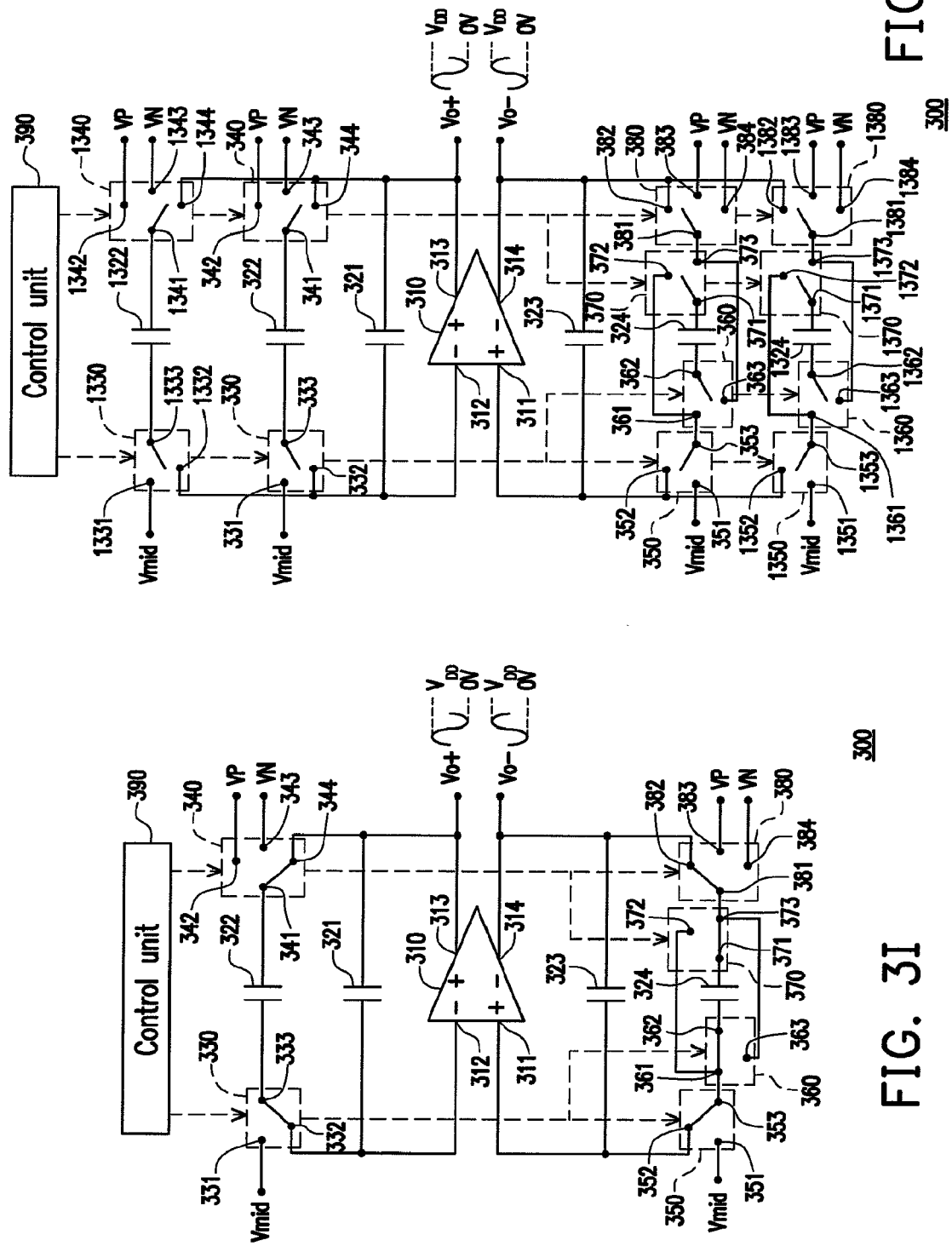

Finally, during the fourth period, the control unit 390 controls the second terminal 332 of the first switch 330 to electrically connect to the third terminal 333 thereof, controls the first terminal 341 of the second switch 340 to electrically connect to the fourth terminal 344 thereof, controls the second terminal 352 of the third switch 350 to electrically connect to the third terminal 353 thereof, controls the first terminal 361 of the fourth switch 360 to electrically connect to the second terminal 362 thereof, controls the first terminal 371 of the fifth switch 370 to electrically connect to the third terminal 373 thereof, and controls the first terminal 381 of the sixth switch 380 to electrically connect to the second terminal 382 thereof, as shown in FIG. 3I.

Thus, charges stored in the second capacitor 322 and the fourth capacitor 324 during the third period are now respectively transferred to the first capacitor 321 and the third capacitor 323. However, since the charges stored in the second capacitor 322 and the fourth capacitor 324 during the third period are not influenced by the signal dependent loadings caused by the second capacitor 322 and the fourth capacitor 324, harmonic distortions of the analog signals Vo+ and Vo− respectively output from the non-inverting output terminal 313 and the inverting output terminal 314 of the operational amplifier 310 are then avoided.

It should be noted that the first period and the second period form a clock cycle of the SC-DAC 300. Similarly, the third period and the fourth period also form the clock cycle of the SC-DAC 300.

According to the SC-DAC 300 of the third embodiment, since each time when the second period is changed to the third period, or each time when the fourth period is changed back to the first period, the signal dependent charges of the second capacitor 322 and the fourth capacitor 324 remained during the second period or the fourth period are counteracted, the charges of the second capacitor 322 and the fourth capacitor 324 stored during the first period or the third period are then not influenced by the remained signal dependent charges generated during a former clock period thereof.

Accordingly, the SC-DAC 300 of the third embodiment may also eliminate the influence of the signal dependent loadings during each clock cycle, and therefore compared to the conventional SC-DAC provided by Frith et al., the harmonic distortions of the analog signals converted by the conventional SC-DAC are totally solved by the SC-DAC 300 of the third embodiment.

Moreover, in the third embodiment, the first and the second periods/the third and the fourth periods form one clock cycle of the SC-DAC 300. Therefore, the clock cycle of the SC-DAC 300 of the third embodiment is shorter compared to that of the conventional SC-DAC provided by Pennock, so that a conversion speed of the SC-DAC 300 is also improved.

However, according to the spirit of the present invention, the SC-DAC 300 is not limited to be conversion of just single digital logic bit, and in the following content, conversion of two or more digital logic bits by the SC-DAC 300 is further described for those with ordinary skill in the art.

Fourth Embodiment

FIG. 3J is a circuit diagram illustrating a SC-DAC 300 according to a fourth embodiment of the present invention. Referring to FIG. 3A and FIG. 3J, compared to FIG. 3A, the SC-DAC 300 of FIG. 3J is added with a seventh switch 1330, a fifth capacitor 1322, an eighth switch 1340, a ninth switch 1350, a tenth switch 1360, a sixth capacitor 1324, an eleventh switch 1370 and a twelfth switch 1380. In the fourth embodiment, capacitances of the fifth capacitor 1322 and the sixth capacitor 1324 are the same, and may be equal to the capacitances of the second capacitor 322 and the fourth capacitor 324, though the present embodiment is not limited thereto.

Moreover, coupling methods of the seventh switch 1330, the fifth capacitor 1322, the eighth switch 1340, the ninth switch 1350, the tenth switch 1360, the sixth capacitor 1324, the eleventh switch 1370 and the twelfth switch 1380 respectively correspond to that of the first switch 330, the second capacitor 322, the second switch 340, the third switch 350, the fourth switch 360, the fourth capacitor 324, the fifth switch 370 and the sixth switch 380, and therefore detailed description thereof will not be repeated.

In the fourth embodiment, the control unit 390 controls switching operations of the seventh, the eighth, the ninth, the tenth, the eleventh and the twelfth switches 1330, 1340, 1350, 1360, 1370 and 1380 according to the state of the second digital logic bit, and when the control unit 390 detects the state of the second digital logic bit is the logical high level $V_{DD}$, the switching operations of the seventh, the eighth, the ninth, the tenth, the eleventh and the twelfth switches 1330, 1340, 1350, 1360, 1370 and 1380 under control of the control unit 390 are the same to that of the first, the second, the third, the fourth, the fifth and the sixth switches 330, 340, 350, 360, 370 and 380 under control of the control unit 390 when the control unit 390 detects that the state of the first digital logic bit is the logical high level $V_{DD}$, and therefore detailed description thereof will not be repeated.

Similarly, when the control unit 390 detects the state of the second digital logic bit is the logical low level 0V, the switching operations of the seventh, the eighth, the ninth, the tenth, the eleventh and the twelfth switches 1330, 1340, 1350, 1360, 1370 and 1380 under control of the control unit 390 are the same to that of the first, the second, the third, the fourth, the fifth and the sixth switches 330, 340, 350, 360, 370 and 380 under control of the control unit 390 when the control unit 390 detects that the state of the first digital logic bit is the logical low level 0V, and therefore detailed description thereof will not be repeated. Accordingly, the SC-DAC 300 of FIG. 3J may independently convert two digital logic bits (i.e. the first digital logic bit and the second digital logic bit).

Besides, since in the fourth embodiment, the capacitances of the second capacitor 322, the fourth capacitor 324, the fifth capacitor 1322 and the sixth capacitor 1324 are all the same, intensities of the analog signals Vo+ and Vo− respectively output from the non-inverting output terminal 313 and the inverting output terminal 314 of the fully differential operational amplifier 310 are then equally contributed by the two digital logic bits, namely, a weighted ratio thereof is 1:1, though the spirit of the present invention is not limited thereto. Namely, a multiple relation between the fifth and the sixth capacitors 1322 and 1324 and the second and the third capacitors 322 and 324 may be designed according to an actual requirement, so as to implement a different weighted ratio.

Moreover, according to the fourth embodiment, and deduced by analogy, conversion of more than two digital logic bits by the SC-DAC 300 then may be deduced by those with ordinary skill in the art, and therefore detailed description thereof will not be repeated.

Fifth Embodiment

Figure 4B:
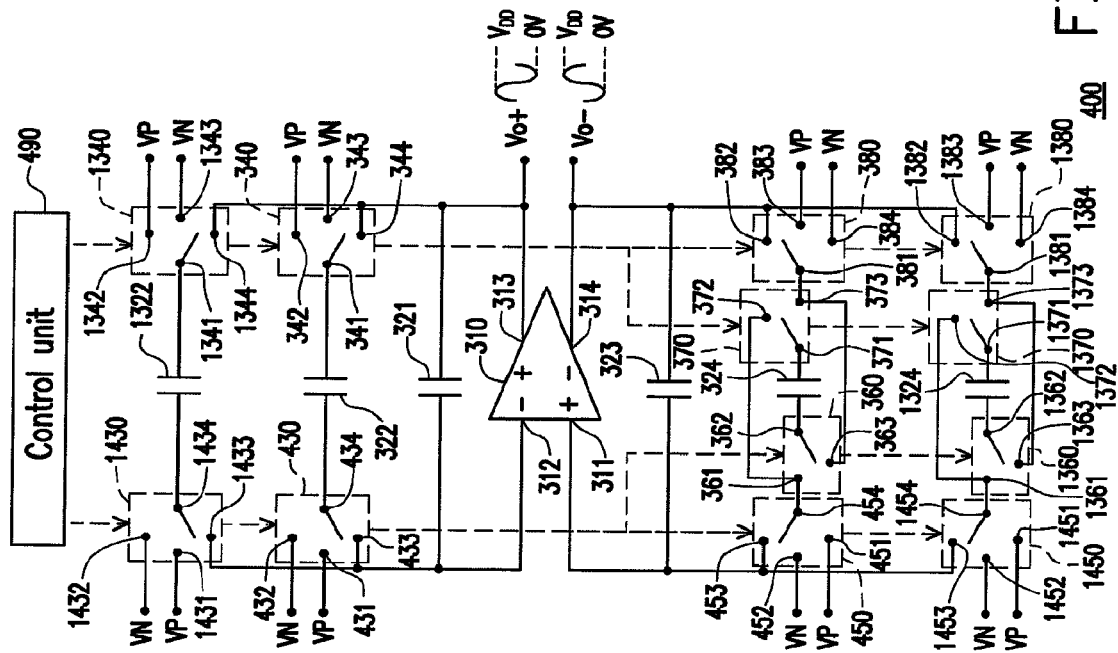
FIG. 4B is a circuit diagram illustrating a SC-DAC according to a sixth embodiment of the present invention.
Figure 4A:
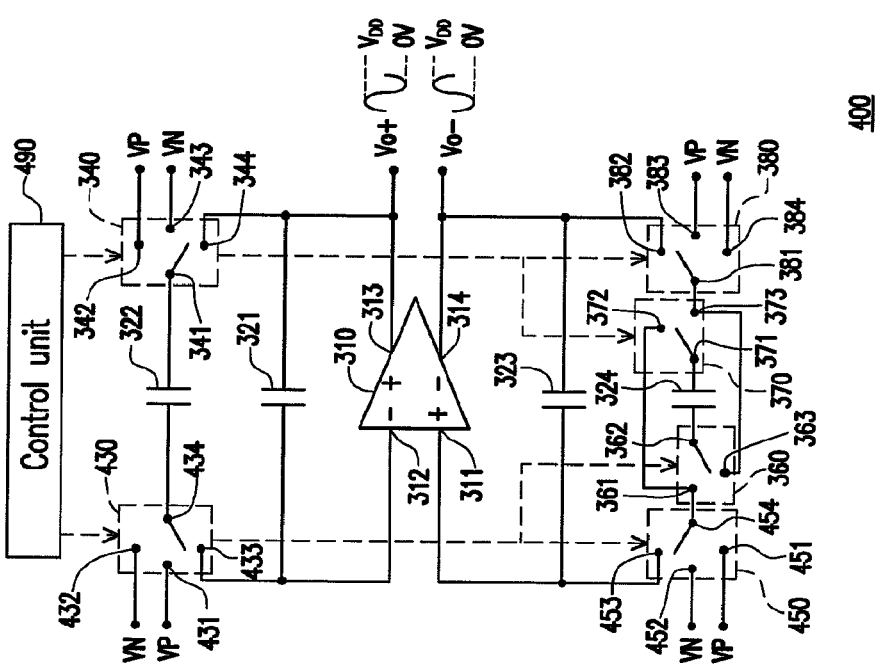
FIG. 4A is a circuit diagram illustrating a SC-DAC according to a fifth embodiment of the present invention.

FIG. 4A is a circuit diagram illustrating a SC-DAC 400 according to a fifth embodiment of the present invention. Referring to FIG. 3A and FIG. 4A, the SC-DAC 400 includes a fully differential operational amplifier 310, a first capacitor 321, a first switch 430, a second capacitor 322, a second switch 340, a third capacitor 323, a third switch 450, a fourth switch 360, a fourth capacitor 324, a fifth switch 370, a sixth switch 380 and a control unit 490. The fully differential operational amplifier 310 has a non-inverting input terminal 311, an inverting input terminal 312, a non-inverting output terminal 313 and an inverting output terminal 314. One terminal of the first capacitor 321 is coupled to the inverting input terminal 312 of the fully differential operational amplifier 310, and another terminal of the first capacitor 321 is coupled to the non-inverting output terminal 313 of the fully differential operational amplifier 310.

A first terminal 431 of the first switch 430 is used for receiving a first signal VP (generally having a logical high level $V_{DD}$, and is supplied from an external voltage source, though the present embodiment is not limited thereof), a second terminal 432 of the first switch 430 is used for receiving a second signal VN (generally having a logical low level 0V, and is supplied from the external voltage source, though the present embodiment is not limited thereof), and a third terminal 433 of the first switch 430 is coupled to the inverting input terminal 312 of the fully differential operational amplifier 310. One terminal of the second capacitor 322 is coupled to a fourth terminal 434 of the first switch 430. A first terminal 341 of the second switch 340 is coupled to another terminal of the second capacitor 322, a second terminal 342 of the second switch 340 is used for receiving the first signal VP, a third terminal 343 of the second switch 340 is used for receiving the second signal VN, and a fourth terminal 344 of the second switch 340 is coupled to the non-inverting output terminal 313 of the fully differential operational amplifier 310.

One terminal of the third capacitor 323 is coupled to the non-inverting input terminal 311 of the fully differential operational amplifier 310, and another terminal of the third capacitor 323 is coupled to the inverting output terminal 314 of the fully differential operational amplifier 310. A first terminal 451 of the third switch 450 is used for receiving the first signal VP, and a second terminal 452 of the third switch 450 is used for receiving the second signal VN, and a third terminal 453 of the third switch is coupled to the non-inverting input terminal 311 of the fully differential operational amplifier 310. A first terminal 361 of the fourth switch 360 is coupled to a fourth terminal 454 of the third switch 450. One terminal of the fourth capacitor 324 is coupled to a second terminal 362 of the fourth switch 360. A first terminal 371 of the fifth switch 370 is coupled to another terminal of the fourth capacitor 324, a second terminal 372 of the fifth switch 370 is coupled to the first terminal 361 of the fourth switch 360, and a third terminal 373 of the fifth switch 370 is coupled to a third terminal 363 of the fourth switch 360.

A first terminal 381 of the sixth switch 380 is coupled to the third terminal 373 of the fifth switch 370, a second terminal 382 of the sixth switch 380 is coupled to the inverting output terminal 314 of the fully differential operational amplifier 310, a third terminal 383 of the sixth switch 380 is used for receiving the first signal VP, and a fourth terminal 384 of the sixth switch 380 is used for receiving the second signal VN.

In the fifth embodiment, the control unit 490 controls switching operations of the first, the second, the third, the fourth, the fifth and the sixth switches 430, 340, 450, 360, 370 and 380 according to the state of the first digital logic bit, and controlling methods thereof are similar to that of the control unit 390 of the third embodiment that controls the switching operations of the first, the second, the third, the fourth, the fifth and the sixth switches 330, 340, 350, 360, 370 and 380 according to the state of the first digital logic bit, and therefore detailed description thereof will not be repeated.

By comparing the embodiment of FIG. 4A to the embodiment of FIG. 3A, it is obvious that the first switch 430 and the third switch 450 may receive the first signal VP and the second signal VN, which is different from the first switch 330 and the third switch 350 of FIG. 3A that only receive the reference level Vmid (i.e. $\frac{1}{2} \times V_{DD}$).

Therefore, when the control unit 490 detects the state of the first digital logic bit is the logical high level $V_{DD}$, the first switch 430 and the third switch 450 simultaneously receive the second signal VN (not simultaneously receive the reference level Vmid), and the second switch 340 and the sixth switch 380 still simultaneously receive the first signal VP; similarly, when the control unit 490 detects the state of the first digital logic bit is the logical low level 0V, the first switch 430 and the third switch 450 simultaneously receive the first signal VP (not simultaneously receive the reference level Vmid), and the second switch 340 and the sixth switch 380 still simultaneously receive the second signal VN.

Accordingly, since the charges stored in the second capacitor 322 and the fourth capacitor 324 of the SC-DAC 400 during the first period or the third period is twice the capacity compared to the charges stored in the second capacitor 322 and the fourth capacitor 324 of the SC-DAC 300 during the first period or the third period, amplitudes of the analog signals Vo+ and Vo− converted by the SC-DAC 400 is then doubled.

Compared the SC-DAC 400 of the fifth embodiment to the SC-DAC 300 of the third embodiment, besides the maximum amplitudes of the converted analog signals Vo+ and Vo− are twice greater than the maximum amplitudes of the analog signals Vo+ and Vo− converted by the SC-DAC 300 of the third embodiment, the other technical functions achieved by the SC-DAC 300 of the third embodiment may also be achieved by the SC-DAC 400 of the fifth embodiment.

However, according to the spirit of the present invention, the SC-DAC 400 is not limited to be conversion of just single digital logic bit, and in the following content, conversion of two or more digital logic bits by the SC-DAC 400 is further described for those with ordinary skill in the art.

Sixth Embodiment

FIG. 4B is circuit diagram illustrating a SC-DAC 400 according to a sixth embodiment of the present invention. Referring to FIG. 3J, FIG. 4A and FIG. 4B, compared to FIG. 4A, the SC-DAC 400 of FIG. 4B is added with a seventh switch 1430, a fifth capacitor 1322, an eighth switch 1340, a ninth switch 1450, a tenth switch 1360, a sixth capacitor 1324, an eleventh switch 1370 and a twelfth switch 1380.

Moreover, coupling methods of the seventh switch 1430, the fifth capacitor 1322, the eighth switch 1340, the ninth switch 1450, the tenth switch 1360, the sixth capacitor 1324, the eleventh switch 1370 and the twelfth switch 1380 respectively correspond to that of the first switch 430, the second capacitor 322, the second switch 340, the third switch 450, the fourth switch 360, the fourth capacitor 324, the fifth switch 370 and the sixth switch 380, and therefore detailed description thereof will not be repeated.

In the sixth embodiment, the control unit 490 controls switching operations of the seventh, the eighth, the ninth, the tenth, the eleventh and the twelfth switches 1430, 1340, 1450, 1360, 1370 and 1380 according to the state of the second digital logic bit, and controlling methods thereof are similar to that of the control unit 390 of the fourth embodiment that controls the switching operations of the seventh, the eighth, the ninth, the tenth, the eleventh and the twelfth switches 1330, 1340, 1350, 1360, 3170 and 1380 according to the state of the second digital logic bit, and therefore detailed description thereof will not be repeated.

By comparing the embodiment of FIG. 4B to the embodiment of FIG. 3J, it is obvious that the seventh switch 1430 and the ninth switch 1450 may receive the first signal VP and the second signal VN, which is different from the seventh switch 1330 and the ninth switch 1350 of FIG. 3J that only receive the reference level Vmid (i.e. $\frac{1}{2} \times V_{DD}$).

Therefore, when the control unit 490 detects the state of the second digital logic bit is the logical high level $V_{DD}$, the seventh switch 1430 and the ninth switch 1450 simultaneously receive the second signal VN (not simultaneously receive the reference level Vmid), and the eighth switch 1340 and the twelfth switch 1380 still simultaneously receive the first signal VP; similarly, when the control unit 490 detects the state of the second digital logic bit is the logical low level 0V, the seventh switch 1430 and the ninth switch 1450 simultaneously receive the first signal VP (not simultaneously receive the reference level Vmid), and the eighth switch 1340 and the twelfth switch 1380 still simultaneously receive the second signal VN.

Accordingly, since the charges stored in the fifth capacitor 1322 and the sixth capacitor 1324 of the SC-DAC 400 during the first period or the third period is twice the capacity compared to the charges stored in the fifth capacitor 1322 and the sixth capacitor 1324 of the SC-DAC 300 during the first period or the third period, amplitudes of the analog signals Vo+ and Vo− converted by the SC-DAC 400 is then doubled.

Compared the SC-DAC 400 of the sixth embodiment to the SC-DAC 300 of the fourth embodiment, besides the maximum amplitudes of the converted analog signals Vo+ and Vo− are twice greater than the maximum amplitudes of the analog signals Vo+ and Vo− converted by the SC-DAC 300 of the fourth embodiment, the other technical functions achieved by the SC-DAC 300 of the fourth embodiment may also be achieved by the SC-DAC 400 of the sixth embodiment.

Moreover, according to the sixth embodiment, and deduced by analogy, conversion of more than two digital logic bits by the SC-DAC 400 then may be deduced by those with ordinary skill in the art, and therefore detailed description thereof will not be repeated.

However, the present invention is not limited to the aforementioned first to sixth embodiments. Namely, a concept of the single ended structure for the SC-DAC of the first embodiment may also be replaced by a concept of differential structure. In the following content, such concept is described in detail for those with ordinary skill in the art.

Seventh Embodiment

FIG. 5A is circuit diagram illustrating a SC-DAC 500 according to a seventh embodiment of the present invention. Referring to FIG. 2A and FIG. 5A, the SC-DAC 500 includes a fully differential operational amplifier 510, a first capacitor 520, a first switch 550, a second capacitor 530, a second switch 560, a third switch 570, a third capacitor 540, a fourth switch 580, a fourth capacitor 520', a fifth switch 550', a fifth capacitor 530', a sixth switch 560', a seventh switch 570', a sixth capacitor 540' and an eighth switch 580'. The fully differential operational amplifier 510 has a non-inverting input terminal 511, an inverting input terminal 512, a non-inverting output terminal 513 and an inverting output terminal 514.

One terminal of the first capacitor 520 is coupled to the inverting input terminal 512 of the fully differential operational amplifier 510, and another terminal of the first capacitor 520 is coupled to the non-inverting output terminal 513 of the fully differential operational amplifier 510. A first terminal 551 of the first switch 550 is used for receiving a reference level Vmid, and a second terminal 552 of the first switch 550 is coupled to the inverting input terminal 512 of the fully differential operational amplifier 510. One terminal of the second capacitor 530 is coupled to a third terminal 553 of the first switch 550. In the seventh embodiment, to maximize amplitudes of an analog signal Vo converted by the SC-DAC 500 (i.e. 0~$V_{DD}$), the reference level Vmid is generally designed to be a half of the logical high level $V_{DD}$ (i.e. ½× $V_{DD}$), though the present embodiment is not limited thereto.

A first terminal 561 of the second switch 560 is coupled to another terminal of the second capacitor 530, a second terminal 562 of the second switch 560 is used for receiving a first signal VP (generally having a logical high level $V_{DD}$, and is supplied from an external voltage source which is not shown in FIG. 5A, though the present embodiment is not limited thereof), a third terminal 563 of the second switch 560 is used for receiving a second signal VN (generally having a logical low level 0V, and is supplied from the external voltage source, though the present embodiment is not limited thereof), and a fourth terminal 564 of the second switch 560 is coupled to the non-inverting output terminal 513 of the fully differential operational amplifier 510.

A first terminal 571 of the third switch 570 is coupled to the third terminal 553 of the first switch 550. One terminal of the third capacitor 540 is coupled to a second terminal 572 of the third switch 570. A first terminal 581 of the fourth switch 580 is coupled to another terminal of the third capacitor 540, a second terminal 582 of the fourth switch 580 is coupled to the third terminal 553 of the first switch 550, and a third terminal 583 of the fourth switch 580 is coupled to the third terminal 573 of the third switch 570 and the first terminal 561 of the second switch 560. One terminal of the fourth capacitor 520' is coupled to the non-inverting input terminal 511 of the fully differential operational amplifier 510, and another terminal of the fourth capacitor 520' is coupled to the inverting output terminal 514 of the fully differential operational amplifier 510.

A first terminal 551' of the fifth switch 550' is used for receiving the reference level Vmid, and a second terminal 552' of the fifth switch 550' is coupled to the non-inverting input terminal 511 of the fully differential operational amplifier 510. One terminal of the fifth capacitor 530' is coupled to a third terminal 553' of the fifth switch 550'. A first terminal 561' of the sixth switch 560' is coupled to another terminal of the fifth capacitor 530', a second terminal 562' of the sixth switch 560' is used for receiving the first signal VP, a third terminal 563' of the sixth switch 560' is used for receiving the second signal VN, and a fourth terminal 564' of the sixth switch 560' is coupled to the inverting output terminal 514 of the fully differential operational amplifier 510.

A first terminal 571' of the seventh switch 570' is coupled to the third terminal 553' of the fifth switch 550'. One terminal of the sixth capacitor 540' is coupled to a second terminal 572' of the seventh switch 570'. A first terminal 581' of the eighth switch 580' is coupled to another terminal of the sixth capacitor 540', a second terminal 582' of the eighth switch 580' is coupled to the third terminal 553' of the fifth switch 550', and a third terminal 583' of the eighth switch 580' is coupled to a third terminal 573' of the seventh switch 570' and the first terminal 561' of the sixth switch 560'.

In the seventh embodiment, capacitances of the second capacitor 530 and the third capacitor 540 are the same, and the capacitances of the fifth capacitor 530' and the sixth capacitor 540' are the same. Moreover, the control unit 590 controls switching operations of the first, the second, the third, the fourth, the fifth, the sixth, the seventh and the eighth switches 550, 560, 570, 580, 550', 560', 570' and 580' according to a state of a first digital logic bit (i.e. a single digital logic bit).

Moreover, when the control unit 590 detects the state of the first digital logic bit is the logical high level $V_{DD}$, the switching operations of the first, the second, the third and the fourth switches 550, 560, 570 and 580 under control of the control unit 590 are the same to that of the first, the second, the third and the fourth switches 250, 260, 270 and 280 under control of the control unit 290 of the first embodiment when the control unit 290 detects that the state of the first digital logic bit is the logical high level $V_{DD}$, and therefore detailed description thereof will not be repeated.

In addition, when the control unit 590 detects the state of the first digital logic bit is the logical high level $V_{DD}$, the switching operations of the fifth, the sixth, the seventh and the eighth switches 550', 560', 570' and 580' under control of the control unit 590 are the same to that of the first, the second, the third and the fourth switches 250, 260, 270 and 280 under control of the control unit 290 of the first embodiment when the control unit 290 detects that the state of the first digital logic bit is the logical low level 0V, and therefore detailed description thereof will not be repeated.

Similarly, when the control unit 590 detects the state of the first digital logic bit is the logical low level 0V, the switching operations of the first, the second, the third and the fourth switches 550, 560, 570 and 580 under control of the control unit 590 are the same to that of the first, the second, the third and the fourth switches 250, 260, 270 and 280 under control of the control unit 290 of the first embodiment when the control unit 290 detects that the state of the first digital logic bit is the logical low level 0V, and therefore detailed description thereof will not be repeated.

In addition, when the control unit 590 detects the state of the first digital logic bit is the logical low level 0V, the switching operations of the fifth, the sixth, the seventh and the eighth switches 550', 560', 570' and 580' under control of the control unit 590 are the same to that of the first, the second, the third and the fourth switches 250, 260, 270 and 280 under control of the control unit 290 of the first embodiment when the control unit 290 detects that the state of the first digital logic bit is the logical high level $V_{DD}$, and therefore detailed description thereof will not be repeated.

Accordingly, the SC-DAC 500 of the seventh embodiment may achieve the same technique functions as the SC-DAC 300 of the third embodiment does. However, according to the spirit of the present invention, the SC-DAC 500 is not limited to be conversion of just single digital logic bit, and in the following content, conversion of two or more digital logic bits by the SC-DAC 500 is further described for those with ordinary skill in the art.

Eighth Embodiment

FIG. 5B is a circuit diagram illustrating a SC-DAC 500 according to an eighth embodiment of the present invention. Referring to FIG. 5A and FIG. 5B, compared to FIG. 5A, the SC-DAC 500 of FIG. 5B is added with a ninth switch 1550, a seventh capacitor 1530, a tenth switch 1560, an eleventh switch 1570, an eighth capacitor 1540, a twelfth switch 1580, a thirteenth switch 1550', a ninth capacitor 1530', a fourteenth switch 1560', a fifteenth switch 1570', a tenth capacitor 1540' and a sixteenth switch 1580'.

Moreover, coupling methods of the ninth switch 1550, the seventh capacitor 1530, the tenth switch 1560, the eleventh switch 1570, the eighth capacitor 1540, the twelfth switch 1580, the thirteenth switch 1550', the ninth capacitor 1530', the fourteenth switch 1560', the fifteenth switch 1570', the tenth capacitor 1540' and the sixteenth switch 1580' respectively correspond to that of the first switch 550, the second capacitor 530, the second switch 560, the third switch 570, the third capacitor 540, the fourth switch 580, the fifth switch 550', the fifth capacitor 530', the sixth switch 560', the seventh switch 570', the sixth capacitor 540' and the eighth switch 580', and therefore detailed description thereof will not be repeated.

In the eighth embodiment, the control unit 590 controls the switching operations of the ninth, the tenth, the eleventh, the twelfth, the thirteenth, the fourteenth, the fifteenth and the sixteenth switches 1550, 1560, 1570, 1580, 1550', 1560', 1570' and 1580' according to a state of the second digital logic bit, and when the control unit 590 detects the state of the second digital logic bit is the logical high level $V_{DD}$, the switching operations of the ninth, the tenth, the eleventh, the twelfth, the thirteenth, the fourteenth, the fifteenth and the sixteenth switches 1550, 1560, 1570, 1580, 1550', 1560', 1570' and 1580' under control of the control unit 590 are the same to that of the first, the second, the third, the fourth, the fifth, the sixth, the seventh and the eighth switches 550, 560, 570, 580, 550', 560', 570' and 580' under control of the control unit 590 when the control unit 590 detects that the state of the first digital logic bit is the logical high level $V_{DD}$, and therefore detailed description thereof will not be repeated.

Similarly, when the control unit 590 detects the state of the second digital logic bit is the logical low level 0V, the switching operations of the ninth, the tenth, the eleventh, the twelfth, the thirteenth, the fourteenth, the fifteenth and the sixteenth switches 1550, 1560, 1570, 1580, 1550', 1560', 1570' and 1580' under control of the control unit 590 are the same to that of the first, the second, the third, the fourth, the fifth, the sixth, the seventh and the eighth switches 550, 560, 570, 580, 550', 560', 570' and 580' under control of the control unit 590 when the control unit 590 detects that the state of the first digital logic bit is the logical low level 0V, and therefore detailed description thereof will not be repeated.

Accordingly, the SC-DAC 500 of the eighth embodiment may also achieve the same technical functions as the SC-DAC 300 of the fourth embodiment does. Moreover, it should be noted that if the amplitudes of the analog signals Vo+ and Vo− converted by the SC-DAC 500 of the seventh and the eighth embodiments are about to be further doubled, only the reference level Vmid received by the first switch 550 and the ninth switch 1550 thereof is required to be changed to the first signal VP (when the states of the first and the second digital logic bits are the logical low level 0V) or the second signal VN (when the states of the first and the second digital logic bits are the logical high level $V_{DD}$), and only the reference level Vmid received by the fifth switch 550' and the thirteenth switch 1550' thereof is required to be changed to the first signal VP (when the states of the first and the second digital logic bits are the logical high level $V_{DD}$) or the second signal VN (when the states of the first and the second digital logic bits are the logical low level 0V), so as to double the amplitudes of the analog signals Vo+ and Vo− converted by the SC-DAC 500.

Ninth Embodiment

FIG. 6A is a circuit diagram illustrating a SC-DAC 600 according to a ninth embodiment of the present invention. Referring to FIG. 6A, a circuit structure of the SC-DAC 600 is the single ended structure including an operational amplifier 610, a first capacitor 620, a second capacitor 630, a third capacitor 640, a first switch 650, a second switch 660, a third switch 670, a fourth switch 680 and a control unit 690. The operational amplifier 610 has a non-inverting input terminal 611, an inverting input terminal 612 and an output terminal 613.

The non-inverting input terminal 611 of the operational amplifier 610 is used for receiving a first reference level Vmid1, one terminal of the first capacitor 620 is coupled to the inverting input terminal 612 of the operational amplifier 610, and another terminal of the first capacitor 620 is coupled to the output terminal 613 of the operational amplifier 610.

A first terminal 651 of the first switch 650 is used for receiving a first signal VP (generally having a logical high level $V_{DD}$, and is supplied from an external voltage source which is not shown in FIG. 6A, though the present embodiment is not limited thereto), a second terminal 652 of the first switch 650 is used for receiving a second signal VN (generally having a logical low level 0V, and is supplied from the external voltage source, though the present embodiment is not limited thereto), a third terminal 653 of the first switch 650 is coupled to the inverting input terminal 612 of the operational amplifier 610, and a fourth terminal 654 of the first switch 650 is coupled to one terminal of the second capacitor 630. An other terminal of the second capacitor 630 is coupled to a fourth terminal 664 of the second switch 660, a first terminal 661 of the second switch 660 is used for receiving the first signal VP, a second terminal 662 of the second switch 660 is used for receiving the second signal VN, and a third terminal 663 of the second switch 660 is coupled to the output terminal 613 of the operational amplifier 610.

A first terminal 671 of the third switch 670 is coupled to the fourth terminal 654 of the first switch 650. One terminal of the third capacitor 640 is coupled to a second terminal 672 of the third switch 670. A first terminal 681 of the fourth switch 680 is coupled to another terminal of the third capacitor 640, a second terminal 682 of the fourth switch 680 is coupled to the fourth terminal 654 of the first switch 650, and a third terminal 683 of the fourth switch 680 is coupled to a third terminal 673 of the third switch 670 and the fourth terminal 664 of the second switch 660.

In the ninth embodiment, capacitances of the second capacitor 630 and the third capacitor 640 are the same, and are respectively a half of the capacitance of the capacitor 130 (i.e. the capacitor 130 in the conventional structure is equally divided into two relatively small capacitors). Moreover, the control unit 690 controls switching operations of the first, the second, the third and the fourth switches 650, 660, 670 and 680 according to a state of a first digital logic bit (i.e. a single digital logic bit), and controlling methods that the control unit 690 controls the switching operations of the first, the second, the third and the fourth switches 650, 660, 670 and 680 are similar to that of the control unit 290 of the first embodiment that controls the switching operations of the first, the second, the third and the fourth switches 250, 260, 270 and 280 according to the state of the first digital logic bit, and therefore detailed description thereof will not be repeated.

By comparing the embodiment of FIG. 6A to the embodiment of FIG. 2A, it is obvious that the first switch 650 may receive the first signal VP and the second signal VN, which is different from the first switch 250 of FIG. 2A that only receives the reference level Vmid2.

Therefore, when the control unit 690 detects the state of the first digital logic bit is the logical high level $V_{DD}$, the first switch 650 receives the second signal VN (not the reference level Vmid2), and the second switch 660 still receives the first signal VP; similarly, when the control unit 690 detects the state of the first digital logic bit is the logical low level 0V, the first switch 650 receives the first signal VP (not the reference level Vmid2), and the second switch 660 still receives the second signal VN.

Accordingly, since the charges stored in the second capacitor 630 and the third capacitor 640 of the SC-DAC 600 during the first period or the third period is twice the capacity compared to the charges stored in the second capacitor 230 and the third capacitor 240 of the SC-DAC 200 during the first period or the third period, the amplitude of the analog signal Vo converted by the SC-DAC 600 is then doubled.

Compared to the SC-DAC 600 of the ninth embodiment to the SC-DAC 200 of the first embodiment, besides the maximum amplitude of the converted analog signal Vo is twice the greater than the maximum amplitude of the analog signal Vo converted by the SC-DAC 200 of the first embodiment, the other technical functions achieved by the SC-DAC 200 of the first embodiment may also be achieved by the SC-DAC 600 of the ninth embodiment.

However, according to the spirit of the present invention, the SC-DAC 600 is not limited to be conversion of just single digital logic bit, and in the following content, conversion of two or more digital logic bits by the SC-DAC 600 is further described for those with ordinary skill in the art.

Tenth Embodiment

FIG. 6B is a circuit diagram illustrating a SC-DAC 600 according to a tenth embodiment of the present invention. Referring to FIG. 2J, FIG. 6A and FIG. 6B, compared to FIG. 6A, the SC-DAC 600 of FIG. 6B is added with a fifth switch 1650, a sixth switch 1660, a seventh switch 1670, an eighth switch 1680, a fourth capacitor 1630 and a fifth capacitor 1640. Moreover, coupling methods of the fifth switch 1650, the sixth switch 1660, the seventh switch 1670, the eighth switch 1680, the fourth capacitor 1630 and the fifth capacitor 1640 respectively correspond to that of the first switch 650, the second switch 660, the third switch 670, the fourth switch 680, the second capacitor 630 and the third capacitor 640, and therefore detailed description thereof will not be repeated.

In the tenth embodiment, the control unit 690 controls switching operations of the fifth, the sixth, the seventh and the eighth switches 1650, 1660, 1670 and 1680 according to a state of a second digital logic bit, and controlling methods thereof are similar to that of the control unit 290 of the second embodiment that controls the switching operations of the fifth, the sixth, the seventh and the eighth switches 1250, 1260, 1270 and 1280 according to the state of the second digital logic bit, and therefore detailed description thereof will not be repeated.

By comparing the embodiment of FIG. 6B to the embodiment of FIG. 2J, it is obvious that the fifth switch 1650 may receive the first signal VP and the second signal VN, which is different from the fifth switch 1250 of FIG. 2J that only receives the reference level Vmid2.

Therefore, when the control unit 690 detects the state of the second digital logic bit is the logical high level $V_{DD}$, the fifth switch 1650 receives the second signal VN (not the reference level Vmid2), and the sixth switch 1660 still receives the first signal VP; similarly, when the control unit 690 detects the state of the second digital logic bit is the logical low level 0V, the fifth switch 1650 receives the first signal VP (not the reference level Vmid2), and the sixth switch 1660 still receives the second signal VN.

Accordingly, since the charges stored in the fourth capacitor 1630 and the fifth capacitor 1640 of the SC-DAC 600 during the first period or the third period is twice the capacity compared to the charges stored in the fourth capacitor 1230 and the fifth capacitor 1240 of the SC-DAC 200 of the second embodiment during the first period or the third period, the amplitude of the analog signal Vo converted by the SC-DAC 600 is then doubled.

Compared the SC-DAC 600 of the tenth embodiment to the SC-DAC 200 of the second embodiment, besides the maximum amplitude of the converted analog signal Vo is twice the greater than the maximum amplitude of the analog signal Vo converted by the SC-DAC 200 of the second embodiment, the other technical functions achieved by the SC-DAC 200 of the second embodiment may also be achieved by the SC-DAC 600 of the tenth embodiment.

Moreover, according to the tenth embodiment, and deduced by analogy, conversion of more than two digital logic bits by the SC-DAC 600 then may be deduced by those with ordinary skill in the art, and therefore detailed description thereof will not be repeated.

In addition, the first reference level Vmid1, the second reference level Vmid2 and the reference level Vmid mentioned throughout the first to the tenth embodiments may also be supplied by the external voltage source, though the present invention is not limited thereto. According to the spirit of the present invention, the first reference level Vmid1, the second reference level Vmid2, the reference level Vmid, the first signal VP and the second signal VN mentioned throughout the first to the tenth embodiments may also be supplied by a buffer within an integrated circuit.

Accordingly, in case that the first reference level Vmid1, the second reference level Vmid2, the reference level Vmid, the first signal VP and the second signal VN are supplied by the external voltage source, since any of the SC-DACs mentioned throughout the first to the tenth embodiments is not influenced by the signal dependent loading, demand of an output impedance of the external voltage source supplying the first signal VP, the second signal VN, the first reference level Vmid1, the second reference level Vmid2 and the reference level Vmid then may be reduced. Namely, high quality of the external voltage source supplying the first signal VP, the second signal VN, the first reference level Vmid1, the second reference level Vmid2 and the reference level Vmid is not required.

Moreover, in case that the first reference level Vmid1, the second reference level Vmid2, the reference level Vmid, the first signal VP and the second signal VN are supplied by the buffer within the integrated circuit, since any of the SC-DACs mentioned throughout the first to the tenth embodiments is not influenced by the signal dependent loading, a specification and an area of the operational amplifier used for supplying the first reference level Vmid1, the second reference level Vmid2, the reference level Vmid, the first signal VP and the second signal VN within the integrated circuit then may be reduced.

In addition, the capacitors utilized in any of the SC-DACs throughout the first to the tenth embodiments are all bi-polarized type capacitors. Besides, any of the SC-DACs throughout the first to the tenth embodiments may also function as a switched capacitor filter. Accordingly, since any of the SC-DACs throughout the first to the tenth embodiments is not influenced by the signal dependent loading, filtering quality of any of the SC-DACs throughout the first to the tenth embodiments that functions as the switched capacitor filter is then rather high.

In summary, since any of the SC-DACs provided by the present invention is not influenced by the signal dependent loading, harmonic distortion of the analog signal converted by any of the SC-DACs provided by the present invention is then avoided. Moreover, when the SC-DACs provided by the present invention includes a plurality of converting channels, since each of the converting channels is not influenced by its own or other signal dependent loadings, a purpose of channel separation for each of the converting channels is then achieved.

Moreover, the spirit of the present invention may be applied to both of the single ended structure SC-DAC and the differential structure SC-DAC. Besides, since the clock cycle of any of the SC-DACs provided by the present invention is shorter than that of the SC-DAC of the conventional technique (for example, a clock cycle of a DAC circuit provided by Pennock), the conversion speed thereof is accordingly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switched capacitor digital-to-analog converter (SC-DAC), comprising:
    an operational amplifier, having a non-inverting input terminal, an inverting input terminal and an output terminal, wherein the non-inverting input terminal is used for receiving a first reference level;
    a first capacitor, having one terminal coupled to the inverting input terminal, and another terminal coupled to the output terminal;
    a first switch, having a first terminal receiving a second reference level, and a second terminal coupled to the inverting input terminal;
    a second capacitor, having one terminal coupled to a third terminal of the first switch;
    a second switch, having a first terminal coupled to another terminal of the second capacitor, a second terminal receiving a first signal, a third terminal receiving a second signal, and a fourth terminal coupled to the output terminal;
    a third switch, having a first terminal coupled to the third terminal of the first switch;
    a third capacitor, having one terminal coupled to a second terminal of the third switch;
    a fourth switch, having a first terminal coupled to another terminal of the third capacitor, a second terminal coupled to the third terminal of the first switch, and a third terminal coupled to a third terminal of the third switch and the first terminal of the second switch; and
    a control unit, for controlling switching operations of the first, the second, the third and the fourth switches according to a state of a first digital logic bit.

2. The SC-DAC as claimed in claim 1, wherein when the state of the first digital logic bit is a logical high level, during a first period, the control unit controls the first terminal of the first switch to connect to the third terminal thereof, the first terminal of the second switch to connect to the second terminal thereof, the first terminal of the third switch to connect to the second terminal thereof, and the first terminal of the fourth switch to connect to the third terminal thereof;
    during a second period, the control unit controls the second terminal of the first switch to connect to the third terminal thereof, the first terminal of the second switch to connect to the fourth terminal thereof, the first terminal of the third switch to connect to the second terminal thereof, and the first terminal of the fourth switch to connect to the third terminal thereof;
    during a third period, the control unit controls the first terminal of the first switch to connect to the third terminal thereof, the first terminal of the second switch to connect to the second terminal thereof, the second terminal of the third switch to connect to the third terminal thereof, and the first terminal of the fourth switch to connect to the second terminal thereof; and
    during a fourth period, the control unit controls the second terminal of the first switch to connect to the third terminal thereof, the first terminal of the second switch to connect to the fourth terminal thereof, the second terminal of the third switch to connect to the third terminal thereof, and the first terminal of the fourth switch to connect to the second terminal thereof.

3. The SC-DAC as claimed in claim 1, wherein when the state of the first digital logic bit is a logical low level, during the first period, the control unit controls the first terminal of the first switch to connect to the third terminal thereof, the first terminal of the second switch to connect to the third terminal thereof, the first terminal of the third switch to connect to the second terminal thereof, and the first terminal of the fourth switch to connect to the third terminal thereof;

during the second period, the control unit controls the second terminal of the first switch to connect to the third terminal thereof, the first terminal of the second switch to connect to the fourth terminal thereof, the first terminal of the third switch to connect to the second terminal thereof, and the first terminal of the fourth switch to connect to the third terminal thereof;

during the third period, the control unit controls the first terminal of the first switch to connect to the third terminal thereof, the first terminal of the second switch to connect to the third terminal thereof, the second terminal of the third switch to connect to the third terminal thereof, and the first terminal of the fourth switch to connect to the second terminal thereof; and during the fourth period, the control unit controls the second terminal of the first switch to connect to the third terminal thereof, the first terminal of the second switch to connect to the fourth terminal thereof, the second terminal of the third switch to connect to the third terminal thereof, and the first terminal of the fourth switch to connect to the second terminal thereof.

4. The SC-DAC as claimed in claim 1 further comprising:

a fifth switch, having a first terminal receiving the second reference level, and a second terminal coupled to the inverting input terminal;

a fourth capacitor, having one terminal coupled to a third terminal of the fifth switch;

a sixth switch, having a first terminal coupled to another terminal of the fourth capacitor, a second terminal receiving the first signal, a third terminal receiving the second signal, and a fourth terminal coupled to the output terminal;

a seventh switch, having a first terminal coupled to the third terminal of the fifth switch;

a fifth capacitor, having one terminal coupled to a second terminal of the seventh switch; and an eighth switch, having a first terminal coupled to another terminal of the fifth capacitor, a second terminal coupled to the third terminal of the fifth switch, and a third terminal coupled to a third terminal of the seventh switch and the first terminal of the sixth switch.

5. The SC-DAC as claimed in claim 4, wherein the control unit further controls switching operations of the fifth, the sixth, the seventh and the eighth switches according to a state of a second digital logic bit, wherein when the state of the second digital logic bit is a logical high level, during a first period, the control unit controls the first terminal of the fifth switch to connect to the third terminal thereof, the first terminal of the sixth switch to connect to the second terminal thereof, the first terminal of the seventh switch to connect to the second terminal thereof, and the first terminal of the eighth switch to connect to the third terminal thereof;

during a second period, the control unit controls the second terminal of the fifth switch to connect to the third terminal thereof, the first terminal of the sixth switch to connect to the fourth terminal thereof, the first terminal of the seventh switch to connect to the second terminal thereof, and the first terminal of the eighth switch to connect to the third terminal thereof;

during a third period, the control unit controls the first terminal of the fifth switch to connect to the third terminal thereof, the first terminal of the sixth switch to connect to the second terminal thereof, the second terminal of the seventh switch to connect to the third terminal thereof, and the first terminal of the eighth switch to connect to the second terminal thereof; and during a fourth period, the control unit controls the second terminal of the fifth switch to connect to the third terminal thereof, the first terminal of the sixth switch to connect to the fourth terminal thereof, the second terminal of the seventh switch to connect to the third terminal thereof, and the first terminal of the eighth switch to connect to the second terminal thereof; and when the state of the second digital logic bit is a logical low level, during the first period, the control unit controls the first terminal of the fifth switch to connect to the third terminal thereof, the first terminal of the sixth switch to connect to the third terminal thereof, the first terminal of the seventh switch to connect to the second terminal thereof, and the first terminal of the eighth switch to connect to the third terminal thereof;

during the second period, the control unit controls the second terminal of the fifth switch to connect to the third terminal thereof, the first terminal of the sixth switch to connect to the fourth terminal thereof, the first terminal of the seventh switch to connect to the second terminal thereof, and the first terminal of the eighth switch to connect to the third terminal thereof;

during the third period, the control unit controls the first terminal of the fifth switch to connect to the third terminal thereof, the first terminal of the sixth switch to connect to the third terminal thereof, the second terminal of the seventh switch to connect to the third terminal thereof, and the first terminal of the eighth switch to connect to the second terminal thereof; and during the fourth period, the control unit controls the second terminal of the fifth switch to connect to the third terminal thereof, the first terminal of the sixth switch to connect to the fourth terminal thereof, the second terminal of the seventh switch to connect to the third terminal thereof, and the first terminal of the eighth switch to connect to the second terminal thereof.

6. A switched capacitor digital-to-analog converter (SC-DAC), comprising:

a fully differential operational amplifier, having a non-inverting input terminal, an inverting input terminal, a non-inverting output terminal and an inverting output terminal;

a first capacitor, having one terminal coupled to the inverting input terminal, and another terminal coupled to the non-inverting output terminal;

a first switch, having a first terminal receiving a reference level, and a second terminal coupled to the inverting input terminal;

a second capacitor, having one terminal coupled to a third terminal of the first switch;

a second switch, having a first terminal coupled to another terminal of the second capacitor, a second terminal receiving a first signal, a third terminal receiving a second signal, and a fourth terminal coupled to the non-inverting output terminal;

a third capacitor, having one terminal coupled to the non-inverting input terminal, and another terminal coupled to the inverting output terminal;

a third switch, having a first terminal receiving the reference level, and a second terminal coupled to the non-inverting input terminal;

a fourth switch, having a first terminal coupled to a third terminal of the third switch;

a fourth capacitor, having one terminal coupled to a second terminal of the fourth switch;

a fifth switch, having a first terminal coupled to another terminal of the fourth capacitor, a second terminal coupled to the first terminal of the fourth switch, and a third terminal coupled to a third terminal of the fourth switch;

a sixth switch, having a first terminal coupled to the third terminal of the fifth switch, a second terminal coupled to the inverting output terminal, a third terminal receiving the first signal and a fourth terminal receiving the second signal; and a control unit, for controlling switching operations of the first, the second, the third, the fourth, the fifth and the sixth switches according to a state of a first digital logic bit.

7. The SC-DAC as claimed in claim 6, wherein when the state of the first digital logic bit is a logical high level, during a first period, the control unit controls the first terminal of the first switch to connect to the third terminal thereof, the first terminal of the second switch to connect to the second terminal thereof, the first terminal of the third switch to connect to the third terminal thereof, the first terminal of the fourth switch to connect to the second terminal thereof, the first terminal of the fifth switch to connect to the third terminal thereof, and the first terminal of the sixth switch to connect to the third terminal thereof;

during a second period, the control unit controls the second terminal of the first switch to connect to the third terminal thereof, the first terminal of the second switch to connect to the fourth terminal thereof, the second terminal of the third switch to connect to the third terminal thereof, the second terminal of the fourth switch to connect to the third terminal thereof, the first terminal of the fifth switch to connect to the second terminal thereof, and the first terminal of the sixth switch to connect to the second terminal thereof;

during a third period, the control unit controls the first terminal of the first switch to connect to the third terminal thereof, the first terminal of the second switch to connect to the second terminal thereof, the first terminal of the third switch to connect to the third terminal thereof, the second terminal of the fourth switch to connect to the third terminal thereof, the first terminal of the fifth switch to connect to the second terminal thereof, and the first terminal of the sixth switch to connect to the third terminal thereof; and during a fourth period, the control unit controls the second terminal of the first switch to connect to the third terminal thereof, the first terminal of the second switch to connect to the fourth terminal thereof, the second terminal of the third switch to connect to the third terminal thereof, the first terminal of the fourth switch to connect to the second terminal thereof, the first terminal of the fifth switch to connect to the third terminal thereof, and the first terminal of the sixth switch to connect to the second terminal thereof.

8. The SC-DAC as claimed in claim 6, wherein when the state of the first digital logic bit is a logical low level, during a first period, the control unit controls the first terminal of the first switch to connect to the third terminal thereof, the first terminal of the second switch to connect to the third terminal thereof, the first terminal of the third switch to connect to the third terminal thereof, the first terminal of the fourth switch to connect to the second terminal thereof, the first terminal of the fifth switch to connect to the third terminal thereof, and the first terminal of the sixth switch to connect to the fourth terminal thereof;

during a second period, the control unit controls the second terminal of the first switch to connect to the third terminal thereof, the first terminal of the second switch to connect to the fourth terminal thereof, the second terminal of the third switch to connect to the third terminal thereof, the second terminal of the fourth switch to connect to the third terminal thereof, the first terminal of the fifth switch to connect to the second terminal thereof, and the first terminal of the sixth switch to connect to the second terminal thereof;

during a third period, the control unit controls the first terminal of the first switch to connect to the third terminal thereof, the first terminal of the second switch to connect to the third terminal thereof, the first terminal of the third switch to connect to the third terminal thereof, the second terminal of the fourth switch to connect to the third terminal thereof, the first terminal of the fifth switch to connect to the second terminal thereof, and the first terminal of the sixth switch to connect to the fourth terminal thereof; and during a fourth period, the control unit controls the second terminal of the first switch to connect to the third terminal thereof, the first terminal of the second switch to connect to the fourth terminal thereof, the second terminal of the third switch to connect to the third terminal thereof, the first terminal of the fourth switch to connect to the second terminal thereof, the first terminal of the fifth switch to connect to the third terminal thereof, and the first terminal of the sixth switch to connect to the second terminal thereof.

9. The SC-DAC as claimed in claim 6 further comprising:

a seventh switch, having a first terminal receiving the reference level, and a second terminal coupled to the inverting input terminal;

a fifth capacitor, having one terminal coupled to a third terminal of the seventh switch;

an eighth switch, having a first terminal coupled to another terminal of the fifth capacitor, a second terminal receiving the first signal, a third terminal receiving the second signal, and a fourth terminal coupled to the non-inverting output terminal;

a ninth switch, having a first terminal receiving the reference level, and a second terminal coupled to the non-inverting input terminal;

a tenth switch, having a first terminal coupled to a third terminal of the ninth switch;

a sixth capacitor, having one terminal coupled to a second terminal of the tenth switch;

an eleventh switch, having a first terminal coupled to another terminal of the sixth capacitor, a second terminal coupled to the first terminal of the tenth switch, and a third terminal coupled to a third terminal of the tenth switch; and a twelfth switch, having a first terminal coupled to the third terminal of the eleventh switch, a second terminal coupled to the inverting output terminal, a third terminal receiving the first signal, and a fourth terminal receiving the second signal.

10. The SC-DAC as claimed in claim 9, wherein the control unit further controls switching operations of the seventh, the eighth, the ninth, the tenth, the eleventh and the twelfth switches according to a state of a second digital logic bit, wherein when the state of the second digital logic bit is a logical high level, during a first period, the control unit controls the first terminal of the seventh switch to connect to the third terminal thereof, the first terminal of the eighth switch to connect to the second terminal thereof, the first terminal of the ninth switch to connect to the third terminal thereof, the first terminal of the tenth switch to connect to the second terminal thereof, the first terminal of the eleventh switch to connect to the third terminal thereof, and the first terminal of the twelfth switch to connect to the third terminal thereof;

during a second period, the control unit controls the second terminal of the seventh switch to connect to the third terminal thereof, the first terminal of the eighth switch to connect to the fourth terminal thereof, the second terminal of the ninth switch to connect to the third terminal thereof, the second terminal of the tenth switch to connect to the third terminal thereof, the first terminal of the eleventh switch to connect to the second terminal thereof, and the first terminal of the twelfth switch to connect to the second terminal thereof;

during a third period, the control unit controls the first terminal of the seventh switch to connect to the third terminal thereof, the first terminal of the eighth switch to connect to the second terminal thereof, the first terminal of the ninth switch to connect to the third terminal thereof, the second terminal of the tenth switch to connect to the third terminal thereof, the first terminal of the eleventh switch to connect to the second terminal thereof, and the first terminal of the twelfth switch to connect to the third terminal thereof; and during a fourth period, the control unit controls the second terminal of the seventh switch to connect to the third terminal thereof, the first terminal of the eighth switch to connect to the fourth terminal thereof, the second terminal of the ninth switch to connect to the third terminal thereof, the first terminal of the tenth switch to connect to the second terminal thereof, the first terminal of the eleventh switch to connect to the third terminal thereof, and the first terminal of the twelfth switch to connect to the second terminal thereof; and when the state of the second digital logic bit is a logical low level, during the first period, the control unit controls the first terminal of the seventh switch to connect to the third terminal thereof, the first terminal of the eighth switch to connect to the third terminal thereof, the first terminal of the ninth switch to connect to the third terminal thereof, the first terminal of the tenth switch to connect to the second terminal thereof, the first terminal of the eleventh switch to connect to the third terminal thereof, and the first terminal of the twelfth switch to connect to the fourth terminal thereof;

during the second period, the control unit controls the second terminal of the seventh switch to connect to the third terminal thereof, the first terminal of the eighth switch to connect to the fourth terminal thereof, the second terminal of the ninth switch to connect to the third terminal thereof, the second terminal of the tenth switch to connect to the third terminal thereof, the first terminal of the eleventh switch to connect to the second terminal thereof, and the first terminal of the twelfth switch to connect to the second terminal thereof;

during the third period, the control unit controls the first terminal of the seventh switch to connect to the third terminal thereof, the first terminal of the eighth switch to connect to the third terminal thereof, the first terminal of the ninth switch to connect to the third terminal thereof, the second terminal of the tenth switch to connect to the third terminal thereof, the first terminal of the eleventh switch to connect to the second terminal thereof, and the first terminal of the twelfth switch to connect to the fourth terminal thereof; and during the fourth period, the control unit controls the second terminal of the seventh switch to connect to the third terminal thereof, the first terminal of the eighth switch to connect to the fourth terminal thereof, the second terminal of the ninth switch to connect to the third terminal thereof, the first terminal of the tenth switch to connect to the second terminal thereof, the first terminal of the eleventh switch to connect to the third terminal thereof, and the first terminal of the twelfth switch to connect to the second terminal thereof.

11. A switched capacitor digital-to-analog converter (SC-DAC), comprising:
an operational amplifier, having a non-inverting input terminal, an inverting input terminal and an output terminal, wherein the non-inverting input terminal is used for receiving a first reference level;
a first capacitor, having one terminal coupled to the inverting input terminal, and another terminal coupled to the output terminal;
a first switch, having a first terminal receiving a first signal, a second terminal receiving a second signal, and a third terminal coupled to the inverting input terminal;
a second capacitor, having one terminal coupled to a fourth terminal of the first switch;
a second switch, having a first terminal receiving the first signal, a second terminal receiving the second signal, a third terminal coupled to the output terminal, and a fourth terminal coupled to another terminal of the second capacitor;
a third switch, having a first terminal coupled to the fourth terminal of the first switch;
a third capacitor, having one terminal coupled to a second terminal of the third switch;
a fourth switch, having a first terminal coupled to another terminal of the third capacitor, a second terminal coupled to the fourth terminal of the first switch, and a third terminal coupled to a third terminal of the third switch and the fourth terminal of the second switch; and
a control unit, for controlling switching operations of the first, the second, the third and the fourth switches according to a state of a first digital logic bit.

12. The SC-DAC as claimed in claim 11, wherein when the state of the first digital logic bit is a logical high level, during a first period, the control unit controls the second terminal of the first switch to connect to the fourth terminal thereof, the first terminal of the second switch to connect to the fourth terminal thereof, the first terminal of the third switch to connect to the second terminal thereof, and the first terminal of the fourth switch to connect to the third terminal thereof;

during a second period, the control unit controls the third terminal of the first switch to connect to the fourth terminal thereof, the third terminal of the second switch to connect to the fourth terminal thereof, the first terminal of the third switch to connect to the second terminal thereof, and the first terminal of the fourth switch to connect to the third terminal thereof;

during a third period, the control unit controls the second terminal of the first switch to connect to the fourth terminal thereof, the first terminal of the second switch to connect to the fourth terminal thereof, the second terminal of the third switch to connect to the third terminal thereof, and the first terminal of the fourth switch to connect to the second terminal thereof; and during a fourth period, the control unit controls the third terminal of the first switch to connect to the fourth terminal thereof, the third terminal of the second switch to connect to the fourth terminal thereof, the second terminal of the third switch to connect to the third terminal thereof, and the first terminal of the fourth switch to connect to the second terminal thereof.

13. The SC-DAC as claimed in claim 11, wherein when the state of the first digital logic bit is a logical low level, during a first period, the control unit controls the first terminal of the first switch to connect to the fourth terminal thereof, the second terminal of the second switch to connect to the fourth terminal thereof, the first terminal of the third switch to connect to the second terminal thereof, and the first terminal of the fourth switch to connect to the third terminal thereof;

during a second period, the control unit controls the third terminal of the first switch to connect to the fourth terminal thereof, the third terminal of the second switch to connect to the fourth terminal thereof, the first terminal of the third switch to connect to the second terminal thereof, and the first terminal of the fourth switch to connect to the third terminal thereof;

during a third period, the control unit controls the first terminal of the first switch to connect to the fourth terminal thereof, the second terminal of the second switch to connect to the fourth terminal thereof, the second terminal of the third switch to connect to the third terminal thereof, and the first terminal of the fourth switch to connect to the second terminal thereof; and during a fourth period, the control unit controls the third terminal of the first switch to connect to the fourth terminal thereof, the third terminal of the second switch to connect to the fourth terminal thereof, the second terminal of the third switch to connect to the third terminal thereof, and the first terminal of the fourth switch to connect to the second terminal thereof.

14. The SC-DAC as claimed in claim 11 further comprising:

a fifth switch, having a first terminal receiving the first signal, a second terminal receiving the second signal, and a third terminal coupled to the inverting input terminal;

a fourth capacitor, having one terminal coupled to a fourth terminal of the fifth switch;

a sixth switch, having a first terminal receiving the first signal, a second terminal receiving the second signal, a third terminal coupled to the output terminal, and a fourth terminal coupled to another terminal of the fourth capacitor;

a seventh switch, having a first terminal coupled to the fourth terminal of the fifth switch;

a fifth capacitor, having one terminal coupled to a second terminal of the seventh switch; and an eighth switch, having a first terminal coupled to another terminal of the fifth capacitor, a second terminal coupled to the fourth terminal of the fifth switch, and a third terminal coupled to a third terminal of the seventh switch and the fourth terminal of the sixth switch.

15. The SC-DAC as claimed in claim 14, wherein the control unit further controls switching operations of the fifth, the sixth, the seventh and the eighth switches according to a state of a second digital logic bit, wherein when the state of the second digital logic bit is a logical high level, during a first period, the control unit controls the second terminal of the fifth switch to connect to the fourth terminal thereof, the first terminal of the sixth switch to connect to the fourth terminal thereof, the first terminal of the seventh switch to connect to the second terminal thereof, and the first terminal of the eighth switch to connect to the third terminal thereof;

during a second period, the control unit controls the third terminal of the fifth switch to connect to the fourth terminal thereof, the third terminal of the sixth switch to connect to the fourth terminal thereof, the first terminal of the seventh switch to connect to the second terminal thereof, and the first terminal of the eighth switch to connect to the third terminal thereof;

during a third period, the control unit controls the second terminal of the fifth switch to connect to the fourth terminal thereof, the first terminal of the sixth switch to connect to the fourth terminal thereof, the second terminal of the seventh switch to connect to the third terminal thereof, and the first terminal of the eighth switch to connect to the second terminal thereof; and during a fourth period, the control unit controls the third terminal of the fifth switch to connect to the fourth terminal thereof, the third terminal of the sixth switch to connect to the fourth terminal thereof, the second terminal of the seventh switch to connect to the third terminal thereof, and the first terminal of the eighth switch to connect to the second terminal thereof; and when the state of the second digital logic bit is a logical low level, during the first period, the control unit controls the first terminal of the fifth switch to connect to the fourth terminal thereof, the second terminal of the sixth switch to connect to the fourth terminal thereof, the first terminal of the seventh switch to connect to the second terminal thereof, and the first terminal of the eighth switch to connect to the third terminal thereof;

during the second period, the control unit controls the third terminal of the fifth switch to connect to the fourth terminal thereof, the third terminal of the sixth switch to connect to the fourth terminal thereof, the first terminal of the seventh switch to connect to the second terminal thereof, and the first terminal of the eighth switch to connect to the third terminal thereof;

during the third period, the control unit controls the first terminal of the fifth switch to connect to the fourth terminal thereof, the second terminal of the sixth switch to connect to the fourth terminal thereof, the second terminal of the seventh switch to connect to the third terminal thereof, and the first terminal of the eighth switch to connect to the second terminal thereof; and during the fourth period, the control unit controls the third terminal of the fifth switch to connect to the fourth terminal thereof, the third terminal of the sixth switch to connect to the fourth terminal thereof, the second terminal of the seventh switch to connect to the third terminal thereof, and the first terminal of the eighth switch to connect to the second terminal thereof.

16. A switched capacitor digital-to-analog converter (SC-DAC), comprising:

a fully differential operational amplifier, having a non-inverting input terminal, an inverting input terminal, a non-inverting output terminal and an inverting output terminal;

a first capacitor, having one terminal coupled to the inverting input terminal, and another terminal coupled to the non-inverting output terminal;

a first switch, having a first terminal receiving a first signal, a second terminal receiving a second signal, and a third terminal coupled to the inverting input terminal;

a second capacitor, having one terminal coupled to a fourth terminal of the first switch;

a second switch, having a first terminal coupled to another terminal of the second capacitor, a second terminal receiving the first signal, a third terminal receiving the second signal, and a fourth terminal coupled to the non-inverting output terminal;

a third capacitor, having one terminal coupled to the non-inverting input terminal, and another terminal coupled to the inverting output terminal;

a third switch, having a first terminal receiving the first signal, a second terminal receiving the second signal, and a third terminal coupled to the non-inverting input terminal;

a fourth switch, having a first terminal coupled to a fourth terminal of the third switch;

a fourth capacitor, having one terminal coupled to a second terminal of the fourth switch;

a fifth switch, having a first terminal coupled to another terminal of the fourth capacitor, a second terminal coupled to the first terminal of the fourth switch, and a third terminal coupled to a third terminal of the fourth switch;

a sixth switch, having a first terminal coupled to the third terminal of the fifth switch, a second terminal coupled to the inverting output terminal, a third terminal receiving the first signal and a fourth terminal receiving the second signal; and a control unit, for controlling switching operations of the first, the second, the third, the fourth, the fifth and the sixth switches according to a state of a first digital logic bit.

17. The SC-DAC as claimed in claim 16, wherein when the state of the first digital logic bit is a logical high level, during a first period, the control unit controls the second terminal of the first switch to connect to the fourth terminal thereof, the first terminal of the second switch to connect to the second terminal thereof, the second terminal of the third switch to connect to the fourth terminal thereof, the first terminal of the fourth switch to connect to the second terminal thereof, the first terminal of the fifth switch to connect to the third terminal thereof, and the first terminal of the sixth switch to connect to the third terminal thereof;

during a second period, the control unit controls the third terminal of the first switch to connect to the fourth terminal thereof, the first terminal of the second switch to connect to the fourth terminal thereof, the third terminal of the third switch to connect to the fourth terminal thereof, the second terminal of the fourth switch to connect to the third terminal thereof, the first terminal of the fifth switch to connect to the second terminal thereof, and the first terminal of the sixth switch to connect to the second terminal thereof;

during a third period, the control unit controls the second terminal of the first switch to connect to the fourth terminal thereof, the first terminal of the second switch to connect to the second terminal thereof, the second terminal of the third switch to connect to the fourth terminal thereof, the second terminal of the fourth switch to connect to the third terminal thereof, the first terminal of the fifth switch to connect to the second terminal thereof, and the first terminal of the sixth switch to connect to the third terminal thereof; and during a fourth period, the control unit controls the third terminal of the first switch to connect to the fourth terminal thereof, the first terminal of the second switch to connect to the fourth terminal thereof, the third terminal of the third switch to connect to the fourth terminal thereof, the first terminal of the fourth switch to connect to the second terminal thereof, the first terminal of the fifth switch to connect to the third terminal thereof, and the first terminal of the sixth switch to connect to the second terminal thereof.

18. The SC-DAC as claimed in claim 16, wherein when the state of the first digital logic bit is a logical low level, during a first period, the control unit controls the first terminal of the first switch to connect to the fourth terminal thereof, the first terminal of the second switch to connect to the third terminal thereof, the first terminal of the third switch to connect to the fourth terminal thereof, the first terminal of the fourth switch to connect to the second terminal thereof, the first terminal of the fifth switch to connect to the third terminal thereof, and the first terminal of the sixth switch to connect to the fourth terminal thereof;

during a second period, the control unit controls the third terminal of the first switch to connect to the fourth terminal thereof, the first terminal of the second switch to connect to the fourth terminal thereof, the third terminal of the third switch to connect to the fourth terminal thereof, the second terminal of the fourth switch to connect to the third terminal thereof, the first terminal of the fifth switch to connect to the second terminal thereof, and the first terminal of the sixth switch to connect to the second terminal thereof;

during a third period, the control unit controls the first terminal of the first switch to connect to the fourth terminal thereof, the first terminal of the second switch to connect to the third terminal thereof, the first terminal of the third switch to connect to the fourth terminal thereof, the second terminal of the fourth switch to connect to the third terminal thereof, the first terminal of the fifth switch to connect to the second terminal thereof, and the first terminal of the sixth switch to connect to the fourth terminal thereof; and during a fourth period, the control unit controls the third terminal of the first switch to connect to the fourth terminal thereof, the first terminal of the second switch to connect to the fourth terminal thereof, the third terminal of the third switch to connect to the fourth terminal thereof, the first terminal of the fourth switch to connect to the second terminal thereof, the first terminal of the fifth switch to connect to the third terminal thereof, and the first terminal of the sixth switch to connect to the second terminal thereof.

19. The SC-DAC as claimed in claim 16 further comprising:

a seventh switch, having a first terminal receiving the first signal, a second terminal receiving the second signal, and a third terminal coupled to the inverting input terminal;

a fifth capacitor, having one terminal coupled to a fourth terminal of the seventh switch;

an eighth switch, having a first terminal coupled to another terminal of the fifth capacitor, a second terminal receiving the first signal, a third terminal receiving the second signal, and a fourth terminal coupled to the non-inverting output terminal;

a ninth switch, having a first terminal receiving the first signal, a second terminal receiving the second signal, and a third terminal coupled to the non-inverting input terminal;

a tenth switch, having a first terminal coupled to a fourth terminal of the ninth switch;

a sixth capacitor, having one terminal coupled to a second terminal of the tenth switch;

an eleventh switch, having a first terminal coupled to another terminal of the sixth capacitor, a second terminal coupled to the first terminal of the tenth switch, and a third terminal coupled to a third terminal of the tenth switch; and a twelfth switch, having a first terminal coupled to the third terminal of the eleventh switch, a second terminal coupled to the inverting output terminal, a third terminal receiving the first signal, and a fourth terminal receiving the second signal.

20. The SC-DAC as claimed in claim 19, wherein the control unit further controls switching operations of the seventh, the eighth, the ninth, the tenth, the eleventh and the twelfth switches according to a state of a second digital logic bit, wherein when the state of the second digital logic bit is a logical high level, during a first period, the control unit controls the second terminal of the seventh switch to connect to the fourth terminal thereof, the first terminal of the eighth switch to connect to the second terminal thereof, the second terminal of the ninth switch to connect to the fourth terminal thereof, the first terminal of the tenth switch to connect to the second terminal thereof, the first terminal of the eleventh switch to connect to the third terminal thereof, and the first terminal of the twelfth switch to connect to the third terminal thereof;

during a second period, the control unit controls the third terminal of the seventh switch to connect to the fourth terminal thereof, the first terminal of the eighth switch to connect to the fourth terminal thereof, the third terminal of the ninth switch to connect to the fourth terminal thereof, the second terminal of the tenth switch to connect to the third terminal thereof, the first terminal of the eleventh switch to connect to the second terminal thereof, and the first terminal of the twelfth switch to connect to the second terminal thereof;

during a third period, the control unit controls the second terminal of the seventh switch to connect to the fourth terminal thereof, the first terminal of the eighth switch to connect to the second terminal thereof, the second terminal of the ninth switch to connect to the fourth terminal thereof, the second terminal of the tenth switch to connect to the third terminal thereof, the first terminal of the eleventh switch to connect to the second terminal thereof, and the first terminal of the twelfth switch to connect to the third terminal thereof; and during a fourth period, the control unit controls the third terminal of the seventh switch to connect to the fourth terminal thereof, the first terminal of the eighth switch to connect to the fourth terminal thereof, the third terminal of the ninth switch to connect to the fourth terminal thereof, the first terminal of the tenth switch to connect to the second terminal thereof, the first terminal of the eleventh switch to connect to the third terminal thereof, and the first terminal of the twelfth switch to connect to the second terminal thereof; and when the state of the second digital logic bit is a logical low level, during the first period, the control unit controls the first terminal of the seventh switch to connect to the fourth terminal thereof, the first terminal of the eighth switch to connect to the third terminal thereof, the first terminal of the ninth switch to connect to the fourth terminal thereof, the first terminal of the tenth switch to connect to the second terminal thereof, the first terminal of the eleventh switch to connect to the third terminal thereof, and the first terminal of the twelfth switch to connect to the fourth terminal thereof;

during the second period, the control unit controls the third terminal of the seventh switch to connect to the fourth terminal thereof, the first terminal of the eighth switch to connect to the fourth terminal thereof, the third terminal of the ninth switch to connect to the fourth terminal thereof, the second terminal of the tenth switch to connect to the third terminal thereof, the first terminal of the eleventh switch to connect to the second terminal thereof, and the first terminal of the twelfth switch to connect to the second terminal thereof;

during the third period, the control unit controls the first terminal of the seventh switch to connect to the fourth terminal thereof, the first terminal of the eighth switch to connect to the third terminal thereof, the first terminal of the ninth switch to connect to the fourth terminal thereof, the second terminal of the tenth switch to connect to the third terminal thereof, the first terminal of the eleventh switch to connect to the second terminal thereof, and the first terminal of the twelfth switch to connect to the fourth terminal thereof; and during the fourth period, the control unit controls the third terminal of the seventh switch to connect to the fourth terminal thereof, the first terminal of the eighth switch to connect to the fourth terminal thereof, the third terminal of the ninth switch to connect to the fourth terminal thereof, the first terminal of the tenth switch to connect to the second terminal thereof, the first terminal of the eleventh switch to connect to the third terminal thereof, and the first terminal of the twelfth switch to connect to the second terminal thereof.

21. A switched capacitor digital-to-analog converter (SC-DAC), comprising:

a fully differential operational amplifier, having a non-inverting input terminal, an inverting input terminal, a non-inverting output terminal and an inverting output terminal;

a first capacitor, having one terminal coupled to the inverting input terminal, and another terminal coupled to the non-inverting output terminal;

a first switch, having a first terminal receiving a reference level, a second terminal coupled to the inverting input terminal;

a second capacitor, having one terminal coupled to a third terminal of the first switch;

a second switch, having a first terminal coupled to another terminal of the second capacitor, a second terminal receiving a first signal, a third terminal receiving a second signal, and a fourth terminal coupled to the non-inverting output terminal;

a third switch, having a first terminal coupled to the third terminal of the first switch;

a third capacitor, having one terminal coupled to a second terminal of the third switch;

a fourth switch, having a first terminal coupled to another terminal of the third capacitor, a second terminal coupled to the third terminal of the first switch, and a third terminal coupled to a third terminal of the third switch and the first terminal of the second switch;

a fourth capacitor, having one terminal coupled to the non-inverting input terminal, and another terminal coupled to the inverting output terminal;

a fifth switch, having a first terminal receiving the reference level, and a second terminal coupled to the non-inverting input terminal;

a fifth capacitor, having one terminal coupled to a third terminal of the fifth switch;

a sixth switch, having a first terminal coupled to another terminal of the fifth capacitor, a second terminal receiving the first signal, a third terminal receiving the second signal, and a fourth terminal coupled to the inverting output terminal;

a seventh switch, having a first terminal coupled to the third terminal of the fifth switch;

a sixth capacitor, having one terminal coupled to a second terminal of the seventh switch;

an eighth switch, having a first terminal coupled to another terminal of the sixth capacitor, a second terminal coupled to the third terminal of the fifth switch, and a third terminal coupled to a third terminal of the seventh switch and the first terminal of the sixth switch; and a control unit, for controlling switching operations of the first, the second, the third, the fourth, the fifth, the sixth, the seventh and the eighth switches according to a state of a first digital logic bit.

22. The SC-DAC as claimed in claim 21, wherein when the state of the first digital logic bit is a logical high level, during a first period, the control unit controls the first terminal of the first switch to connect to the third terminal thereof, the first terminal of the second switch to connect to the second terminal thereof, the first terminal of the third switch to connect to the second terminal thereof, the first terminal of the fourth switch to connect to the third terminal thereof, the first terminal of the fifth switch to connect to the third terminal thereof, the first terminal of the sixth switch to connect to the third terminal thereof, the first terminal of the seventh switch to connect to the second terminal thereof, and the first terminal of the eighth switch to connect to the third terminal thereof;

during a second period, the control unit controls the second terminal of the first switch to connect to the third terminal thereof, the first terminal of the second switch to connect to the fourth terminal thereof, the first terminal of the third switch to connect to the second terminal thereof, the first terminal of the fourth switch to connect to the third terminal thereof, the second terminal of the fifth switch to connect to the third terminal thereof, the first terminal of the sixth switch to connect to the fourth terminal thereof, the first terminal of the seventh switch to connect to the second terminal thereof, and the first terminal of the eighth switch to connect to the third terminal thereof;

during a third period, the control unit controls the first terminal of the first switch to connect to the third terminal thereof, the first terminal of the second switch to connect to the second terminal thereof, the second terminal of the third switch to connect to the third terminal thereof, the first terminal of the fourth switch to connect to the second terminal thereof, the first terminal of the fifth switch to connect to the third terminal thereof, the first terminal of the sixth switch to connect to the third terminal thereof, the second terminal of the seventh switch to connect to the third terminal thereof, and the first terminal of the eighth switch to connect to the second terminal thereof; and during a fourth period, the control unit controls the second terminal of the first switch to connect to the third terminal thereof, the first terminal of the second switch to connect to the fourth terminal thereof, the second terminal of the third switch to connect to the third terminal thereof, the first terminal of the fourth switch to connect to the second terminal thereof, the second terminal of the fifth switch to connect to the third terminal thereof, the first terminal of the sixth switch to connect to the fourth terminal thereof, the second terminal of the seventh switch to connect to the third terminal thereof, and the first terminal of the eighth switch to connect to the second terminal thereof.

23. The SC-DAC as claimed in claim 21, wherein when the state of the first digital logic bit is a logical low level, during a first period, the control unit controls the first terminal of the first switch to connect to the third terminal thereof, the first terminal of the second switch to connect to the third terminal thereof, the first terminal of the third switch to connect to the second terminal thereof, the first terminal of the fourth switch to connect to the third terminal thereof, the first terminal of the fifth switch to connect to the third terminal thereof, the first terminal of the sixth switch to connect to the second terminal thereof, the first terminal of the seventh switch to connect to the second terminal thereof, and the first terminal of the eighth switch to connect to the third terminal thereof;

during a second period, the control unit controls the second terminal of the first switch to connect to the third terminal thereof, the first terminal of the second switch to connect to the fourth terminal thereof, the first terminal of the third switch to connect to the second terminal thereof, the first terminal of the fourth switch to connect to the third terminal thereof, the second terminal of the fifth switch to connect to the third terminal thereof, the first terminal of the sixth switch to connect to the fourth terminal thereof, the first terminal of the seventh switch to connect to the second terminal thereof, and the first terminal of the eighth switch to connect to the third terminal thereof;

during a third period, the control unit controls the first terminal of the first switch to connect to the third terminal thereof, the first terminal of the second switch to connect to the third terminal thereof, the second terminal of the third switch to connect to the third terminal thereof, the first terminal of the fourth switch to connect to the second terminal thereof, the first terminal of the fifth switch to connect to the third terminal thereof, the first terminal of the sixth switch to connect to the second terminal thereof, the second terminal of the seventh switch to connect to the third terminal thereof, and the first terminal of the eighth switch to connect to the second terminal thereof; and during a fourth period, the control unit controls the second terminal of the first switch to connect to the third terminal thereof, the first terminal of the second switch to connect to the fourth terminal thereof, the second terminal of the third switch to connect to the third terminal thereof, the first terminal of the fourth switch to connect to the second terminal thereof, the second terminal of the fifth switch to connect to the third terminal thereof, the first terminal of the sixth switch to connect to the fourth terminal thereof, the second terminal of the seventh switch to connect to the third terminal thereof, and the first terminal of the eighth switch to connect to the second terminal thereof.

24. The SC-DAC as claimed in claim 21 further comprising:

a ninth switch, having a first terminal receiving the reference level, and a second terminal coupled to the inverting input terminal;

a seventh capacitor, having one terminal coupled to a third terminal of the ninth switch;

a tenth switch, having a first terminal coupled to another terminal of the seventh capacitor, a second terminal receiving the first signal, a third terminal receiving the second signal, and a fourth terminal coupled to the non-inverting output terminal;

an eleventh switch, having a first terminal coupled to the third terminal of the ninth switch;

an eighth capacitor, having one terminal coupled to a second terminal of the eleventh switch;

a twelfth switch, having a first terminal coupled to another terminal of the eighth capacitor, a second terminal coupled to the third terminal of the ninth switch, a third terminal coupled to a third terminal of the eleventh switch and the first terminal of the tenth switch;

a thirteenth switch, having a first terminal receiving the reference level, and a second terminal coupled to the non-inverting input terminal;

a ninth capacitor, having one terminal coupled to a third terminal of the thirteenth switch;

a fourteenth switch, having a first terminal coupled to another terminal of the ninth capacitor, a second terminal receiving the first signal, a third terminal receiving the second signal, and a fourth terminal coupled to the inverting output terminal;

a fifteenth switch, having a first terminal coupled to the third terminal of the thirteenth switch;

a tenth capacitor, having one terminal coupled to a second terminal of the fifteenth switch; and a sixteenth switch, having a first terminal coupled to another terminal of the tenth capacitor, a second terminal coupled to the third terminal of the thirteenth switch, and a third terminal coupled to a third terminal of the fifteenth switch and the first terminal of the fourteenth switch.

25. The SC-DAC as claimed in claim 24, wherein the control unit further controls switching operations of the ninth, the tenth, the eleventh, the twelfth, the thirteenth, the fourteenth, the fifteenth and the sixteenth switches according to a state of a second digital logic bit, wherein when the state of the second digital logic bit is a logical high level, during a first period, the control unit controls the first terminal of the ninth switch to connect to the third terminal thereof, the first terminal of the tenth switch to connect to the second terminal thereof, the first terminal of the eleventh switch to connect to the second terminal thereof, the first terminal of the twelfth switch to connect to the third terminal thereof, the first terminal of the thirteenth switch to connect to the third terminal thereof, the first terminal of the fourteenth switch to connect to the third terminal thereof, the first terminal of the fifteenth switch to connect to the second terminal thereof, and the first terminal of the sixteenth switch to connect to the third terminal thereof;

during a second period, the control unit controls the second terminal of the ninth switch to connect to the third terminal thereof, the first terminal of the tenth switch to connect to the fourth terminal thereof, the first terminal of the eleventh switch to connect to the second terminal thereof, the first terminal of the twelfth switch to connect to the third terminal thereof, the second terminal of the thirteenth switch to connect to the third terminal thereof, the first terminal of the fourteenth switch to connect to the fourth terminal thereof, the first terminal of the fifteenth switch to connect to the second terminal thereof, and the first terminal of the sixteenth switch to connect to the third terminal thereof;

during a third period, the control unit controls the first terminal of the ninth switch to connect to the third terminal thereof, the first terminal of the tenth switch to connect to the second terminal thereof, the second terminal of the eleventh switch to connect to the third terminal thereof, the first terminal of the twelfth switch to connect to the second terminal thereof, the first terminal of the thirteenth switch to connect to the third terminal thereof, the first terminal of the fourteenth switch to connect to the third terminal thereof, the second terminal of the fifteenth switch to connect to the third terminal thereof, and the first terminal of the sixteenth switch to connect to the second terminal thereof; and during a fourth period, the control unit controls the second terminal of the ninth switch to connect to the third terminal thereof, the first terminal of the tenth switch to connect to the fourth terminal thereof, the second terminal of the eleventh switch to connect to the third terminal thereof, the first terminal of the twelfth switch to connect to the second terminal thereof, the second terminal of the thirteenth switch to connect to the third terminal thereof, the first terminal of the fourteenth switch to connect to the fourth terminal thereof, the second terminal of the fifteenth switch to connect to the third terminal thereof, and the first terminal of the sixteenth switch to connect to the second terminal thereof; and when the state of the second digital logic bit is a logical low level, during the first period, the control unit controls the first terminal of the ninth switch to connect to the third terminal thereof, the first terminal of the tenth switch to connect to the third terminal thereof, the first terminal of the eleventh switch to connect to the second terminal thereof, the first terminal of the twelfth switch to connect to the third terminal thereof, the first terminal of the thirteenth switch to connect to the third terminal thereof, the first terminal of the fourteenth switch to connect to the second terminal thereof, the first terminal of the fifteenth switch to connect to the second terminal thereof, and the first terminal of the sixteenth switch to connect to the third terminal thereof;

during the second period, the control unit controls the second terminal of the ninth switch to connect to the third terminal thereof, the first terminal of the tenth switch to connect to the fourth terminal thereof, the first terminal of the eleventh switch to connect to the second terminal thereof, the first terminal of the twelfth switch to connect to the third terminal thereof, the second terminal of the thirteenth switch to connect to the third terminal thereof, the first terminal of the fourteenth switch to connect to the fourth terminal thereof, the first terminal of the fifteenth switch to connect to the second terminal thereof, and the first terminal of the sixteenth switch to connect to the third terminal thereof;

during the third period, the control unit controls the first terminal of the ninth switch to connect to the third terminal thereof, the first terminal of the tenth switch to connect to the third terminal thereof, the second terminal of the eleventh switch to connect to the third terminal thereof, the first terminal of the twelfth switch to connect to the second terminal thereof, the first terminal of the thirteenth switch to connect to the third terminal thereof, the first terminal of the fourteenth switch to connect to the second terminal thereof, the second terminal of the fifteenth switch to connect to the third terminal thereof, and the first terminal of the sixteenth switch to connect to the second terminal thereof; and during the fourth period, the control unit controls the second terminal of the ninth switch to connect to the third terminal thereof, the first terminal of the tenth switch to connect to the fourth terminal thereof, the second terminal of the eleventh switch to connect to the third terminal thereof, the first terminal of the twelfth switch to connect to the second terminal thereof, the second terminal of the thirteenth switch to connect to the third terminal thereof, the first terminal of the fourteenth switch to connect to the fourth terminal thereof, the second terminal of the fifteenth switch to connect to the third terminal thereof, and the first terminal of the sixteenth switch to connect to the second terminal thereof.

* * * * *